United States Patent
Awazu

(10) Patent No.: US 8,102,460 B2
(45) Date of Patent: Jan. 24, 2012

(54) SOLID-STATE IMAGING DEVICE

(75) Inventor: Kouhei Awazu, Saitama (JP)

(73) Assignee: Fujifilm Corporation, Tokyo (JP)

(*) Notice: Subject to any disclaimer, the term of this patent is extended or adjusted under 35 U.S.C. 154(b) by 0 days.

(21) Appl. No.: 13/124,069

(22) PCT Filed: Sep. 30, 2010

(86) PCT No.: PCT/JP2010/067035
§ 371 (c)(1),
(2), (4) Date: Apr. 13, 2011

(87) PCT Pub. No.: WO2011/061998
PCT Pub. Date: May 26, 2011

(65) Prior Publication Data
US 2011/0221947 A1     Sep. 15, 2011

(30) Foreign Application Priority Data

Nov. 20, 2009    (JP) .................... 2009-264758

(51) Int. Cl.
*H04N 5/225* (2006.01)
(52) U.S. Cl. .................. 348/340; 348/335
(58) Field of Classification Search ............ 348/335, 348/340; 396/626
See application file for complete search history.

(56) References Cited

U.S. PATENT DOCUMENTS

| | | | |
|---|---|---|---|
| 6,734,031 B2 | 5/2004 | Shizukuishi | |
| 7,012,754 B2* | 3/2006 | Boettiger et al. | 359/626 |
| 7,292,279 B2 | 11/2007 | Yamazaki | |
| 2003/0215967 A1 | 11/2003 | Shizukuishi | |
| 2006/0027825 A1 | 2/2006 | Kuriyama | |
| 2007/0146531 A1* | 6/2007 | Toshikiyo | 348/340 |
| 2011/0037888 A1* | 2/2011 | Onuki | 348/340 |

FOREIGN PATENT DOCUMENTS

| | | |
|---|---|---|
| JP | 2959142 B2 | 7/1999 |
| JP | 2003-332547 A | 11/2003 |
| JP | 2004-361611 A | 12/2004 |
| JP | 2005-116939 A | 4/2005 |
| JP | 2006-049721 A | 2/2006 |
| JP | 2007-103590 A | 4/2007 |
| JP | 2007-281296 A | 10/2007 |
| JP | 2007-335723 A | 12/2007 |
| JP | 2008-71920 A | 3/2008 |

OTHER PUBLICATIONS

Written Opinion of the International Searching Authority (ISA) (PCT Form PCT/ISA/237) dated Nov. 2, 2010, with English translation.

* cited by examiner

*Primary Examiner* — Tuan Ho
(74) *Attorney, Agent, or Firm* — McGinn IP Law Group, PLLC

(57) ABSTRACT

A CCD image sensor which is a solid-state imaging device has four kinds of pixels of first pixel to fourth pixel arranged in a predetermined pattern. The each pixel has each PD and each microlens. The first pixel and the fourth pixel are dedicated imaging pixels. The fourth pixel is placed adjacent to the second pixel and the third pixel which are pixels for phase difference detection, and its microlens is formed smaller than the microlens of the first pixel. Accordingly, since quantity of the light to be incident on the PD from the microlens is lowered corresponding to the incident light from the gap between the microlenses, light with approximately uniform quantity is incident on the each PD.

15 Claims, 22 Drawing Sheets

SOLID-STATE IMAGING DEVICE

BACKGROUND OF THE INVENTION

1. Field of the Invention

The present invention relates to a solid-state imaging device, which includes plural dedicated imaging pixels and plural phase difference detection pixels and performs automatic focusing of phase difference method based on an image obtained from the phase difference detection pixel.

2. Description of the Related Arts

Digital cameras, which comprise solid-state imaging device such as a CCD image sensor or a CMOS image sensor and produce a digital image, become widespread. Most of the digital cameras include an autofocus (AF) function to automatically regulate the focus of an imaging lens, and as the AF function, a contrast detection method is widely adopted. Since it is not necessary to additionally provide a dedicated sensor for measuring a distance to a subject or a solid-state imaging device for AF, the contrast detection method has an advantage that the AF function can be realized with relatively low cost.

However, since a focus lens needs to move to obtain a plurality of contrast evaluation values, the contrast detection method has a problem that it takes longer time for focusing in comparison with other methods.

To solve this problem, in Japanese Patent Laid-Open Publication No. 2004-361611, a convex section and a concave section are formed on an imaging surface of the solid-state imaging device, and a photoelectric conversion element for AF is provided on each of the convex section and the concave section. In this configuration, since whether the focus is shifted forwardly or backwardly can be judged from one image capturing by comparing contrast evaluation values of the photoelectric conversion element for AF on the convex section and that on the concave section, a movement range (a search range) of the focus lens becomes narrower, and AF processing becomes of high-speed.

However, in the configuration of Japanese Patent Laid-Open Publication No. 2004-361611, since the focus lens must move in the movement range although which can become narrower, speedup of the AF processing has a limit. For the digital camera, improvement of functions and a low-price policy is progressing, so it is wished that the AF processing could be performed faster without causing increase in cost.

To meet such a demand, a solid-state imaging device for phase difference AF which can perform focus detection by one image capturing is suggested in Japanese Patent No. 2959142 and so on. The solid-state imaging device for phase difference AF comprises a plurality of first pixels in which a microlens is disposed such that an optical axis of the microlens is shifted from the center position of a light receiving surface of a photodiode (PD), and a plurality of second pixels in which a microlens is disposed such that an optical axis of the microlens is shifted the same distance in a direction opposite to the first pixel from the center position of the light receiving surface of the PD.

In the solid-state imaging device for phase difference AF, depending on a shift direction of the microlens, the first pixel and the second pixel have selectivity to an angle of each incident light. When the solid-state imaging device for phase difference AF is applied to the imaging apparatuses such as digital cameras, depending on a focusing state of the imaging lens of the digital camera, displacement (a phase difference) occurs between an image composed by each first pixel and an image composed by each second pixel. A displacement direction and a displacement amount of each image correspond to a displacement direction and a displacement amount of a focus of the imaging lens. Each image accords when the imaging lens becomes in-focus, and a displacement amount becomes the larger when a focus is shifted the farther. Therefore, in the solid-state imaging device for phase difference AF, a focus adjustment quantity of the imaging lens can be calculated by detecting the displacement amount and the displacement direction of the image composed by each first pixel and the image composed by each second pixel.

Accordingly, when the solid-state imaging device for phase difference AF is used, since It is not necessary to move the focus lens, it can perform AF in higher-speed than that of the contrast detection method. In addition, like the contrast detection method, since it is not necessary to provide a dedicated sensor, a solid-state imaging device for AF and so on, there is no increase in cost.

In the first pixel and the second pixel, since it is necessary to shift the optical axis of the microlens from the center position of the light receiving surface of the PD, the microlens needs to be small, and light receiving sensitivity at the time of image capturing becomes the lower than a normal pixel as the microlens becomes the smaller. Therefore, in the solid-state imaging device for phase difference AF, the dedicated imaging pixel consisting of the normal pixel is provided in addition to the phase difference detection pixel consisting of the first pixel and the second pixel, phase difference AF is performed with the phase difference detection pixel, and image capturing of a subject is performed with the dedicated imaging pixel.

However, when the imaging surface is constituted of an arrangement of the phase difference detection pixels and the dedicated imaging pixels, it has a problem that a light receiving amount of the dedicated imaging pixel becomes high at a position adjacent to the phase difference detection pixel. Since the microlens of the phase difference detection pixel is small, at the position where the phase difference detection pixel and the dedicated imaging pixel are next to each other, a gap between the microlenses becomes larger in comparison with the position where the dedicated imaging pixels are next to each other. The increase of the light receiving amount of the dedicated imaging pixel adjacent to the phase difference detection pixel is caused because the PD of the dedicated imaging pixel receives light incident from this gap.

The increase of the light receiving amount of the dedicated imaging pixel as the above appears as a noise on a captured image. To suppress this noise, the increase of the light receiving amount of the dedicated imaging pixel adjacent to the phase difference detection pixel may be corrected when the captured image is formed. However, when the correction process is executed, additional time will be required for imaging. Therefore, it is wished that the solid-state imaging device for phase difference AF is constituted so that light of uniform quantity is incident on the PD of each dedicated imaging pixel.

SUMMARY OF THE INVENTION

The present invention was accomplished in view of the problems mentioned above, and intends to provide a solid-state imaging device for phase difference AF, in which an imaging surface is constituted of an arrangement of phase difference detection pixels and dedicated imaging pixels and it is possible that light of uniform quantity is incident on a PD of each dedicated imaging pixel.

In order to achieve the above purpose, the present invention is characterized in comprising a plurality of phase difference detection pixels having a microlens whose optical axis is shifted in a predetermined direction from the center of a light receiving surface of a photoelectric conversion element, and a plurality of dedicated imaging pixels having a microlens which is larger than the microlens of the phase difference detection pixel and is disposed such that its optical axis is approximately coincidence with the center of a light receiving surface of a photoelectric conversion element, wherein the microlens arranged around the phase difference detection pixel is formed smaller than the other microlenses.

It is more preferable that the plurality of dedicated imaging pixel have microlenses of at least three sizes, and that the size of the microlens becomes smaller progressively as its position becomes closer to the phase difference detection pixel.

It is preferable to form the microlens of the phase difference detection pixel as large as possible, by letting a part of the microlens of the phase difference detection pixel get into a vacant space formed by making the microlens of the adjacent dedicated imaging pixel smaller.

In addition, the present invention may have a constitution comprising a plurality of phase difference detection pixels having a microlens whose optical axis is shifted in a predetermined direction from the center of a light receiving surface of a photoelectric conversion element, and a plurality of dedicated imaging pixels having a microlens which is larger than the microlens of the phase difference detection pixel and is disposed such that its optical axis is approximately coincidence with the center of a light receiving surface of a photoelectric conversion element, wherein a height of the microlens arranged around the phase difference detection pixel from the photoelectric conversion element is lower than a height of the microlens of the phase difference detection pixel.

It is preferable that on a lens forming surface where each microlens is formed, a concave section is formed at a position corresponding to the dedicated imaging pixel arranged around the phase difference detection pixel, and that by forming the microlens on an inner bottom surface of the concave section, the height of the microlens arranged around the phase difference detection pixel from the photoelectric conversion element becomes lower than the height of the microlens of the phase difference detection pixel.

It is more preferable that by forming plural concave sections of different depth in the lens forming surface, the height of the microlens of the dedicated imaging pixel becomes lower progressively as its position becomes closer to the phase difference detection pixel.

It is preferable to let a part of the microlens of the phase difference detection pixel get into a space formed by making the height of the microlens of the adjacent dedicated imaging pixel lower.

It is preferable that on a lens forming surface where each microlens is formed, a convex section is formed at a position corresponding to the phase difference detection pixel, and that by forming the microlens on the convex section, the height of the microlens of the phase difference detection pixel becomes higher than the height of the microlens of the dedicated imaging pixel.

In addition, the present invention may have a constitution comprising a plurality of dedicated imaging pixels having a microlens which is disposed such that its optical axis is approximately coincidence with the center of a light receiving surface of a photoelectric conversion element, and a plurality of phase difference detection pixels having a microlens which is smaller than the microlens of the dedicated imaging pixel and is disposed such that its optical axis is shifted in a predetermined direction from the center of a light receiving surface of a photoelectric conversion element, wherein the microlens has a nonspherical shape where a bottom portion is extended toward a border part with the adjacent dedicated imaging pixel.

In addition, the present invention may have a constitution comprising a plurality of phase difference detection pixels having a microlens whose optical axis is shifted in a predetermined direction from the center of a light receiving surface of a photoelectric conversion element, and a plurality of dedicated imaging pixels having a microlens which is larger than the microlens of the phase difference detection pixel and is disposed such that its optical axis is approximately coincidence with the center of a light receiving surface of a photoelectric conversion element, wherein a height of the photoelectric conversion element arranged around the phase difference detection pixel was lowered on a semiconductor substrate than a height of the photoelectric conversion element of the phase difference detection pixel.

It is preferable that on a surface of the semiconductor substrate, a concave section is formed at a position corresponding to the dedicated imaging pixel arranged around the phase difference detection pixel, and that by forming the photoelectric conversion element on an inner bottom surface of the concave section, the height of the photoelectric conversion element arranged around the phase difference detection pixel becomes lower than the height of the photoelectric conversion element of the phase difference detection pixel.

It is preferable that on a surface of the semiconductor substrate, a convex section is formed at a position corresponding to the phase difference detection pixel, and that by forming the photoelectric conversion element on the convex section, the height of the photoelectric conversion element of the phase difference detection pixel becomes higher than the height of the photoelectric conversion element of the dedicated imaging pixel.

It is preferable that the convex section has a slope formed to be directed toward the microlens of the phase difference detection pixel, and that the photoelectric conversion element of the phase difference detection pixel is formed on the slope.

It is preferable that the dedicated imaging pixel and the phase difference detection pixel have an inner lens under the microlens, and that a shape of each inner lens is changed according to distance with the photoelectric conversion element so that a focus matches the photoelectric conversion element.

In addition, the present invention may have a constitution comprising a plurality of phase difference detection pixels having a microlens whose optical axis is shifted in a predetermined direction from the center of a light receiving surface of a photoelectric conversion element, and a plurality of dedicated imaging pixels having a microlens which is larger than the microlens of the phase difference detection pixel and is disposed such that its optical axis is approximately coincidence with the center of a light receiving surface of a photoelectric conversion element, wherein the photoelectric conversion element arranged around the phase difference detection pixel is inclined such that the light receiving surface is directed to a direction opposite to the phase difference detection pixel.

According to the present invention, the microlens of the dedicated imaging pixel arranged around the phase difference detection pixel is formed to be smaller than the microlens of the other dedicated imaging pixel. In this way, in the dedicated imaging pixel around the phase difference detection pixel, quantity of the light to be incident on the photoelectric conversion element from the microlens becomes lower. Therefore, since a size of the microlens is regulated so that light quantity from the microlens is lowered according to quantity of light to be incident from the gap between the microlens of the dedicated imaging pixel and the microlens of the phase difference detection pixel, light of approximately uniform light quantity can be incident on the photoelectric conversion element of each dedicated imaging pixel.

DETAILED DESCRIPTION OF THE PREFERRED EMBODIMENTS

First Embodiment

Figure 1:
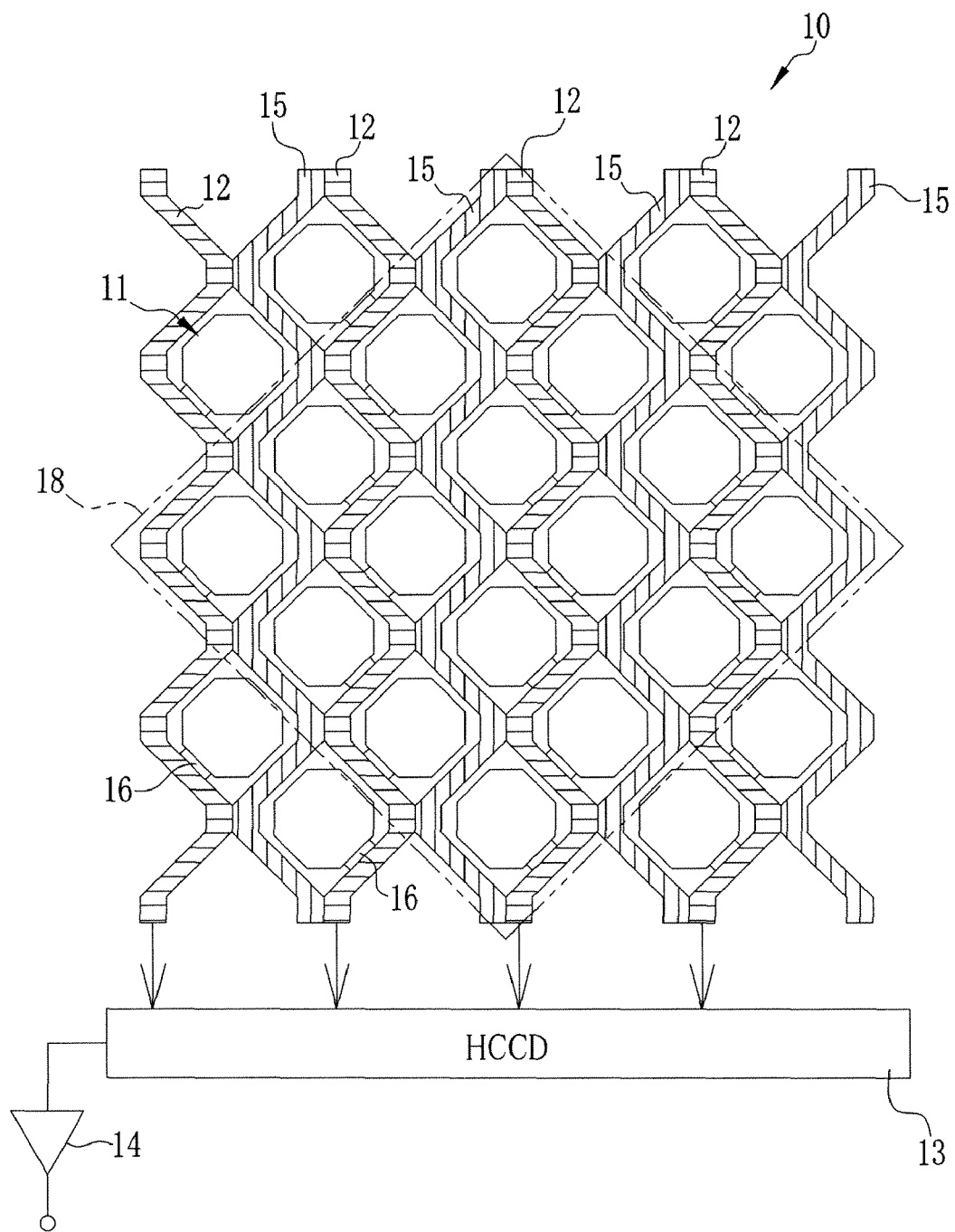
FIG. 1 is an explanatory diagram which schematically shows a constitution of the CCD image sensor.

In FIG. 1, a CCD image sensor (solid-state imaging device) 10 includes a plurality of pixels 11, a plurality of vertical transfer paths (VCCD) 12, a horizontal transfer path (HCCD) 13, and a floating diffusion amplifier (FDA) 14. The pixels 11 are arranged with a predetermined pitch in a vertical direction and a horizontal direction and accumulate electric charge depending on incident light. The VCCD 12 transfers the electric charge that each pixel 11 accumulated to the vertical direction. The HCCD 13 is connected to the end of each VCCD 12, and transfers the electric charge transferred from each VCCD 12 in the horizontal direction. The FDA 14 converts the electric charge transferred from the HCCD 13 into a voltage signal (an imaging signal) and outputs it. Between the adjacent pixels 11, there is a device isolation area 15 which electrically separates each pixel 11 so that the electric charge does not transferred.

The pixels 11 have an arrangement in which that a tetragonal lattice is turned 45 degrees against the horizontal direction and the vertical direction (so-called the honeycomb arrangement). The VCCD 12 and the device isolation area 15 meander to a serrated shape to follow the area between the each pixel 11.

The VCCD 12 is connected to the pixel 11 through a device isolation area 16. The electric charge accumulated to the pixel 11 is read to the VCCD 12 through the readout gate 16. The VCCD 12 is controlled by a four-phase transfer electrode (not illustrated) and transfers the electric charge read from the each pixel 11 in the vertical direction toward the HCCD 13. In addition, the VCCD 12 is provided by one for two lines of the pixels 11, and is constituted to read the electric charge from the each pixel 11 provided at right and left of the VCCD 12.

Figure 2:
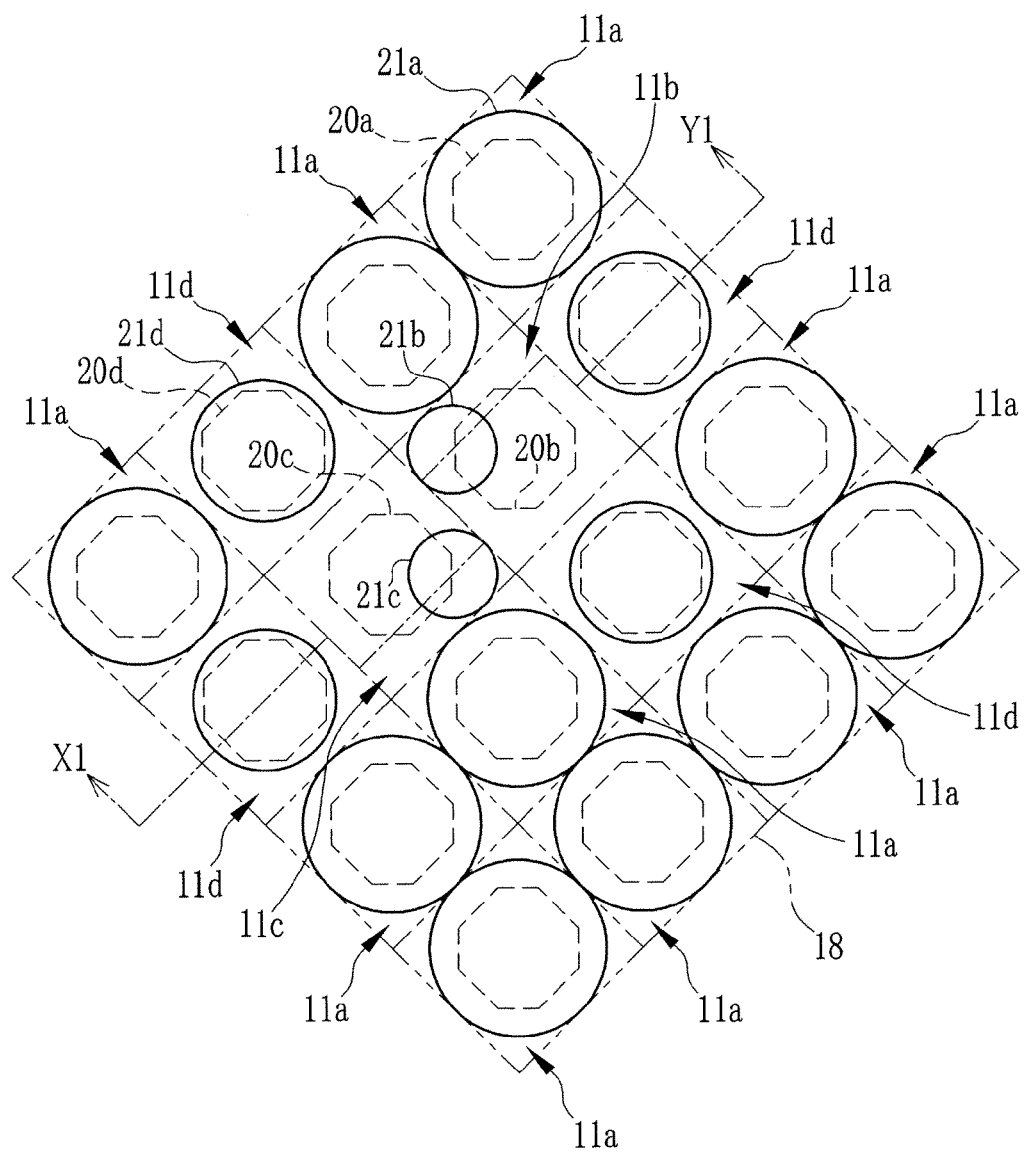
FIG. 2 is an explanatory diagram showing a constitution of a pixel group.

In FIG. 2, the CCD image sensor 10 has four kinds of the pixels 11, which are a first pixel 11a, a second pixel 11b, a third pixel 11c, and a fourth pixel 11d. Each of the four kinds of pixels 11a to 11d is arranged in a predetermined pattern and constitutes a pixel group 18. The pixel group 18 is an arrangement of the 16 pixels consisting of the 10 first pixels 11a, the 1 second pixel 11b, the 1 third pixel 11c and the 4 fourth pixel 11d in a 4 by 4 rectangular grid. The CCD image sensor 10 forms an imaging surface by continually arranging a plurality of the pixel groups 18. In FIG. 1 and FIG. 2, only the one pixel group 18 is illustrated for convenience, but practically the plurality of pixel groups 18 are arranged to be next to each other.

The first pixel 11a includes a photodiode (PD) 20a which is a photoelectric conversion element which converts the incident light into the electric charge and accumulates it, and a microlens 21a which condenses the light into the PD 20a. Similarly, the second to fourth pixels 11b, 11c and 11d respectively include PDs 20b, 20c and 20d and microlenses 21b, 21c and 21d. The each PD 20a to 20d is formed on a semiconductor substrate, with having an approximately same shape and configuration. The each microlens 21a to 21d is formed in an approximately hemisphere shape.

The first pixel 11a is a pixel used at a time of displaying a through image and a time of image forming in execution of image capturing. The microlens 21a of the first pixel 11a is formed such that its optical axis accords with a center of a light receiving surface of the PD 20a and has the approximately maximum diameter against the rectangular area of the first pixel 11a.

The second pixel 11b and the third pixel 11c are used for autofocus of the phase difference method, and are also used for image forming. The pixel group 18 is provided with the second pixel 11b and the third pixel 11c by one each and these are positioned to be next to each other. The microlens 21b of the second pixel 11b is formed to have an approximately half-size compared to the microlens 21a of the first pixel 11a, and its optical axis is placed to be shifted in a predetermined length leftward against the center of the light receiving surface of the PD 20b.

The microlens 21c of the third pixel 11c is formed to have the approximately same size to the microlens 21b of the second pixel 11b, and is placed with being shifted in the same length in the counter direction of the microlens 21b (rightward).

According to the above constitution, the second pixel 11b and the third pixel 11c have selectivity to an angle of the incident light. Specifically, in the second pixel 11b, since the microlens 21b is shifted leftward, light from the right side is not incident on the PD 20b, and light from the left side is incident on the PD 20b. On the other hand, in the third pixel 11c, since the microlens 21c is shifted rightward, light from the left side is not incident on the PD 20c, and light from the right side is incident on the PD 20c.

When the CCD image sensor 10 is used for imaging devices such as digital cameras, a difference (a phase difference) is occurred in the right and left direction between the image which is composed by an image signal of the second pixel 11b provided on the imaging surface and the image which is composed by an image signal of the third pixel 11c, according to a focusing state of an imaging lens which focuses a subject image on the CCD image sensor 10. By detecting the displacement amount and the difference direction of the images, a focus adjustment amount of the imaging lens can be determined. The autofocus of the phase difference method is explained in detail in Japanese Patent No. 2959142 and so on.

The fourth pixel 11d is a pixel used only for image forming like the first pixel 11a. The microlens 21d of the fourth pixel 11d is disposed such that its optical axis accords with the center of the light receiving surface of the PD 20d. The microlens 21d of the fourth pixel 11d is formed to have a diameter which is regulated such that the area (the value that multiplied pi by the diameter) becomes approximately 5% smaller than the microlens 21a of the first pixel 11a. The diameter of the microlens 21d of the fourth pixel 11d is slightly smaller than the diameter of the microlens 21a of the first pixel 11a, and is larger than the diameter of the microlens 21b of the second pixel 11b and the microlens 21c of the third pixel 11c. The fourth pixel 11d is placed adjacent to the second pixel 11b or the third pixel 11c. However, the fourth pixel 11d is placed adjacent to the contralateral side of the displacement direction of each microlens 21b, 21c in four sides that each of the second pixel 11b and the third pixel 11c has. Specifically, since the microlens 21b is shifted leftward to be next to two sides on the left side of the second pixel 11b, the fourth pixel 11d is disposed to be next to two sides on the right side of the second pixel 11b. On the other hand, since the microlens 21c is shifted rightward to be next to two sides on the right side of the third pixel 11c, the fourth pixel 11d is disposed to be next to two sides on the left side of the third pixel 11c.

When the CCD image sensor 10 is used for an imaging apparatus to form an image, all image signals from the each pixel 11a to 11d are used. The image signal from the second pixel 11b and the image signal from the third pixel 11c have a signal level smaller than that of the image signals from the first pixel 11a and the fourth pixel 11d, because the size of the microlenses 21b, 21c are small. Therefore, when an image is formed with the CCD image sensor 10, a process to correct the image signals from the second pixel 11b and the third pixel 11c is carried out based on the image signals from the first pixel 11a and the fourth pixel 11d.

Figure 3:
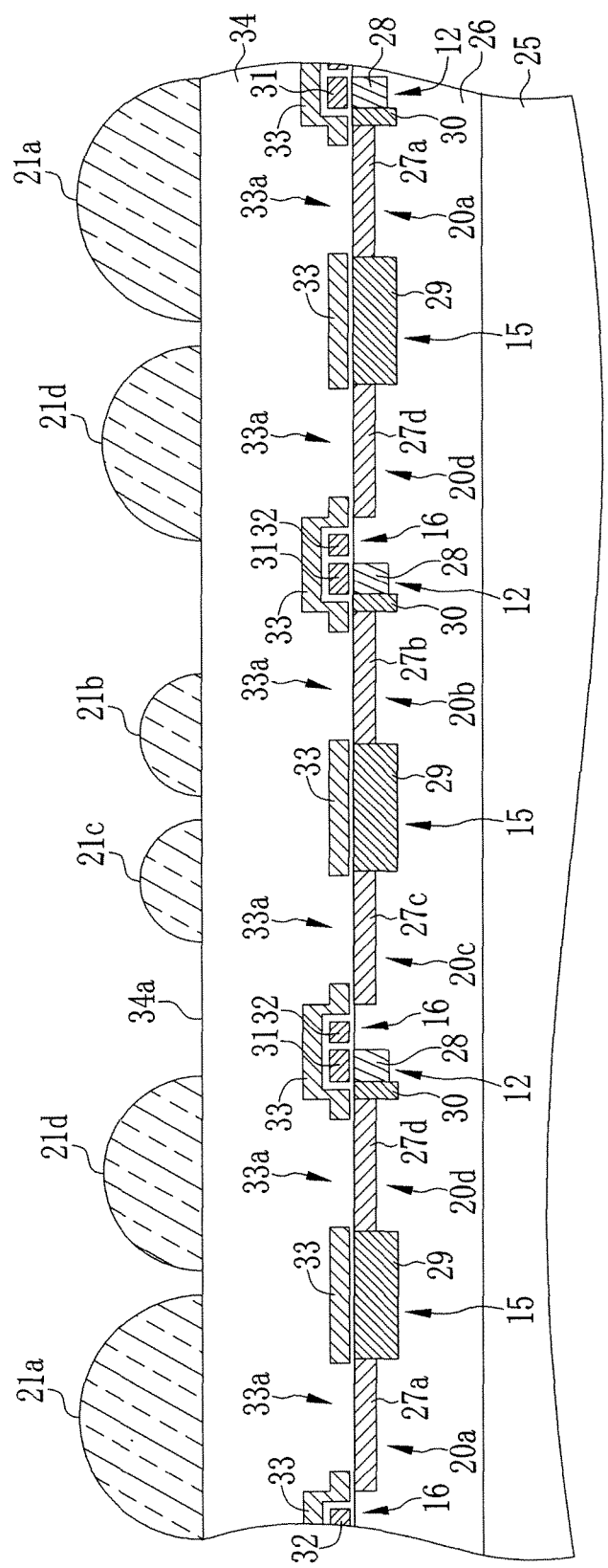
FIG. 3 is partial cross-sectional view which schematically shows a constitution of each pixel.

In FIG. 3 which illustrates a section of cutting-plane line X1-Y1, the CCD image sensor 10 is composed on a n-type semiconductor substrate 25. A p-well layer 26 is formed on a surface of the n-type semiconductor substrate 25. On the top layer of the p-well layer 26, n-type layers 27a to 27d constituting the PDs 20a to 20d, a n-type layer 28 constituting the VCCD 12, a p+ layer 29 constituting the device isolation area 15, and a p+ layer 30 separating the PDs 20a to 20d from the VCCD 12 are formed.

The CCD image sensor 10 is formed on the n-type semiconductor substrate 25 with using well-known techniques such as vapor deposition, doping, photolithography, etching or so on. Note that the cutting-plane line X1-Y1 cuts each part to pass through the center of the each microlens 21a to 21d.

The each PD 20a to 20d is constituted of a pn junction between the p-well layer 26 and the each n-type layer 27a to 27d. The each PD 20a to 20d generates an electron-positive hole pair according to incident light. In the generated electron-positive hole pair, the electron is accumulated in the each n-type layer 27a to 27d. The each n-type layer 27a to 27d is spaced from the each n-type layer 27a to 27d of the adjacent pixel through the p+ layer 29. In addition, the each n-type layer 27a to 27d is spaced from the n-type layer 28 constituting the VCCD 12 through the p+ layer 30. Accordingly, it is prevented that the electric charge accumulated in the n-type layers 27a to 27d involuntarily transfer to other areas.

The VCCD 12 is comprised of a n-type layer 28 and a transfer electrode 31 provided on the n-type layer 28. The each n-type layer 27a to 27d constituting the each PD 20a to 20d is spaced from the n-type layer 28 constituting the VCCD 12 through the p-well layer 26. The readout gate 16 is comprised of a part of the p-well layer 26 between the each n-type layer 27a to 27d and the n-type layer 28, and a transfer electrode 32 provided on this part. For example, a polysilicon is used for the each transfer electrode 31, 32.

The electric charge accumulated in the each n-type layer 27a to 27d is transferred to the n-type layer 28 by applying voltage to the transfer electrode 32 to change an electric potential of the p-well layer 26. According to the voltage applied to the transfer electrode 31 at a predetermined timing, the electric charge transferred to the n-type layer 28 is transferred to a sectional direction (a direction perpendicular to the paper surface). Accordingly, the electric charge accumulated in the each PD 20a to 20d is transferred to the HCCD 13.

The device isolation area 15 forms a potential barrier for the electric charge accumulated in the each n-type layer 27a to 27d, to prevent the electric charge from transferring between the each adjacent PD 20a to 20d.

In addition, a light shielding film 33 is formed to cover the whole surface of the p-well layer 26. The light shielding film 33 is provided with a plurality of opening 33a which let the each n-type layer 27a to 27d expose. The light shielding film 33 prevents that unnecessary light is incident on an area except the PDs 20a to 20d. And a planarizing layer 34 is formed to cover light shielding film 33, and the microlenses 21a to 21d are provided on the planarizing layer 34.

The planarizing layer 34 fills an irregularity on a substrate generated by the transfer electrodes 31 and 32 and so on, and constitutes a planar lens forming surface 34a to form the microlenses 21a to 21d. Translucency materials such as BPSG are used for the planarizing layer 34. The each microlenses 21a to 21d is formed on the lens forming surface 34a, with a positional relationship with the each PD 20a to 20d and a size regulated as described above. In addition, since the each microlens 21a to 21d has an approximately hemisphere shape, the height from the lens forming surface 34a is different according to each diameter.

As illustrated in FIG. 2 and FIG. 3, an area where the second pixel 11b is next to the fourth pixel 11d has a large gap between the microlens 21b and the microlens 21d. Similarly, an area where the third pixel 11b is next to the fourth pixel 11d has a large gap between the microlens 21c and the microlens 21d. Therefore, when the microlens 21d of the fourth pixel 11d is formed at the size same as the microlens 21a of the first pixel 11a, a light receiving amount of the fourth pixel 11d becomes higher than that of the first pixel 11a (specifically, the light receiving amount rises by approximately 5%) under the influence of light to be incident from the gap described above.

In contrast, in this embodiment, the microlens 21d of the fourth pixel 11d is formed to be smaller than the microlens 21a of the first pixel 11a (specifically, has an area approximately 5% smaller). Accordingly, since quantity of the light to be incident on the PD 20d from the microlens 21d is relatively lowered corresponding to the incident light from the gap described above, light with approximately uniform quantity is incident on the each PD 20a, 20d of the first pixel 11a and fourth pixel 11d which are the dedicated imaging pixel.

By the above-described constitution, since the light with approximately uniform quantity is incident on the each PD 20a, 20d and a natural image without the noise can be obtained, a correction process becomes needless. Accordingly, since there is no need to perform the correction process, it is not necessary to be concerned about an increase of processing time for the practice of the correction process and generation of new noise from the correction process.

Note that in this embodiment, although the microlens 21d of the fourth pixel 11d is formed so that its area becomes approximately 5% smaller than that of the microlens 21a of the first pixel 11a, the reduction ratio of the microlens 21d to the microlens 21a is not limited to this, and it may be appropriately decided according to light quantity of the incident light from the above-described gap.

In addition, in this embodiment, although the reduction ratio of the microlens 21d of the fourth pixel 11d to the microlens 21a of the first pixel 11a is the same for all of the microlenses 21d, when quantity of the light to be incident from the gap becomes different according to a direction to be adjacent to the second pixel 11b or the third pixel 11c, a shape of a structure (such as the VCCD 12) formed on the n-type semiconductor substrate 25 and so on, it may appropriately regulate the reduction ratio of the each microlens 21d according to the light quantity. Furthermore, in this embodiment, although the fourth pixel 11d is placed to be next to the second pixel 11b or the third pixel 11c, it is not limited to this and may be place the fourth pixel 11d in any area where an increase of the light receiving amount occurs.

Second Embodiment

Figure 4:
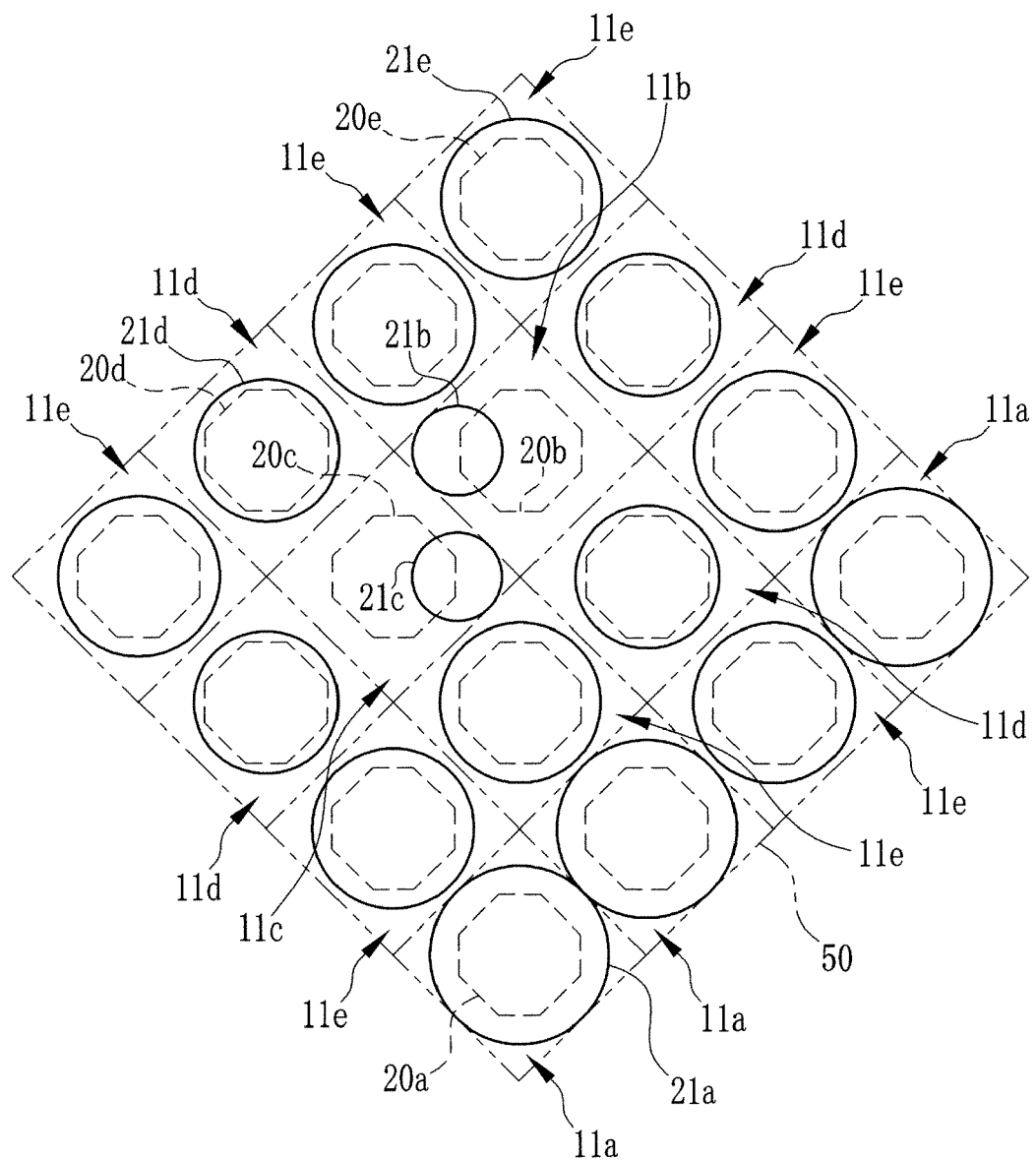
FIG. 4 is an explanatory diagram showing an example in which a size of a microlens of a dedicated imaging pixel around a phase difference detection pixel becomes small progressively.

Next, a second embodiment of the present invention will be explained. Note that it refers same reference numbers about the same components in functions and constitutions as the first embodiment described above, and omits detailed explanation of them. In the first embodiment described above, the pixel group 18 is composed of the four kinds of pixels which are the first pixel 11a to the fourth pixel 11d. In contrast, in this embodiment, as illustrated in FIG. 4, a pixel group 50 is composed of five kinds of pixels including a fifth pixel 11e in addition to the first pixel 11a to the fourth pixel 11d. The pixel group 50 is a replacement of the seven first pixels 11a adjacent to the fourth pixel 11d, among the ten first pixels 11a included in the pixel group 18 of the first embodiment, by the fifth pixels 11e.

The fifth pixel 11e is used for imaging forming at the time of execution of image capturing, with the first pixel 11a and the fourth pixel 11d. The fifth pixel 11e includes a PD 20e and a microlens 21e. The microlens 21e of the fifth pixel 11e is formed in an approximately hemisphere shape, and is disposed such that its optical axis accords with the center of the light receiving surface of the PD 21e. The diameter of the microlens 21e of the fifth pixel 11e is smaller than the diameter of the microlens 21a of the first pixel 11a, and is larger than the diameter of the microlens 21d of the fourth pixel 11d.

For example, when the diameter of the microlens 21d of the fourth pixel 11d is determined so that its area becomes approximately 5% smaller than that of the microlens 21a of the first pixel 11a, the diameter of the microlens 21e of the fifth pixel 11e is determined so that its area becomes approximately 2 to 3% smaller than that of the microlens 21a of the first pixel 11a.

In the first embodiment, since the first pixel 11a is positioned to be adjacent with the fourth pixel 11d, it is concerned about increasing of a light receiving amount of the first pixel 11a adjacent to the fourth pixel 11d, by influence of light to be incident from the gap generated by the difference of the diameters of the microlens 21a and the microlens 21d. In contrast, in this embodiment, since the fifth pixel 11e, which has the microlens 21e smaller than the microlens 21a of the first pixel 11a and larger than the microlens 21d of the fourth pixel 11d, is provided between the first pixel 11a and the fourth pixel 11d, increase of light receiving amount in the fifth pixel 11e adjacent to the fourth pixel 11d is reduced, and increase of light receiving amount in the first pixel 11a adjacent to the fifth pixel 11e is also reduced.

As described above, since the diameter of the microlens of the pixel around the phase difference detection pixels (the second pixel 11b and the third pixel 11c) is progressively reduced as being closer to the phase difference detection pixel, light of uniform quantity is incident on the PD of the dedicated imaging pixel, and an image with few noises can be obtained.

Note that in this embodiment, although the size of the microlens of the pixel around the second pixel 11b and the third pixel 11c is changed in two stages, it may be changed in at least three stages. Concretely, the number of stages may be appropriately determined according to the light quantity of the incident from gap, the constitution of the pixel group and so on.

Third Embodiment

Figure 5:
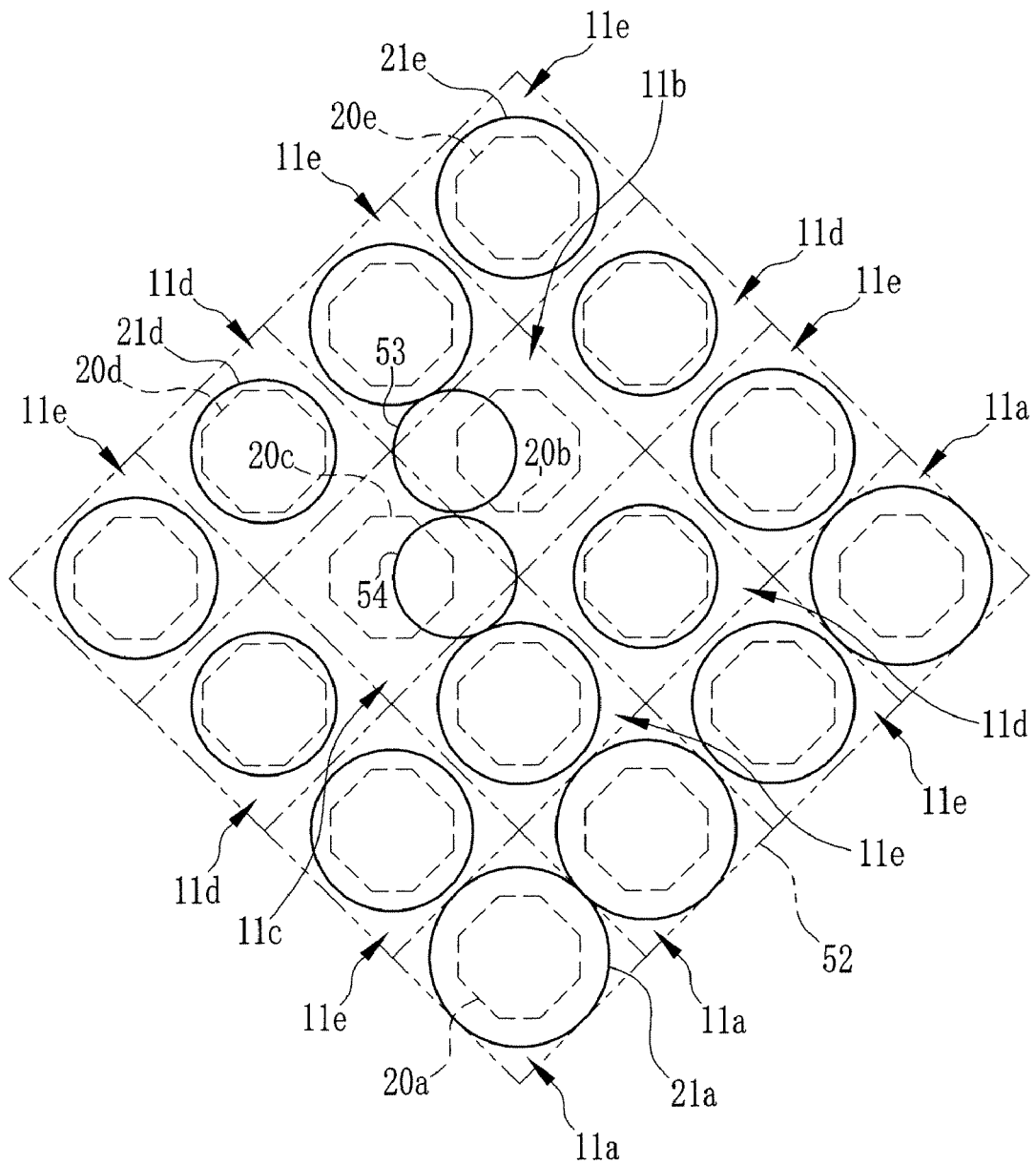
FIG. 5 is an explanatory diagram showing the example in which a microlens of the phase difference detection pixel is made large as much as possible after having made a microlens of the neighboring dedicated imaging pixel smaller.

Next, a third embodiment of the present invention will be explained. In FIG. 5, like the pixel group 50 of the second embodiment described above, a pixel group 52 of this embodiment is comprised of the five kinds of pixels which are the first pixel 11a to the fifth pixel 11e. Of these, the first pixel 11a, the fourth pixel 11d, and the fifth pixel 11e which are the dedicated imaging pixel have the same constructions with those of the second embodiment.

On the other hand, the second pixel 11b has a microlens 53 having a diameter larger than the microlens 21b of the first and second embodiments. The microlens 53 is formed so that a part of it gets into a vacant space of the adjacent third pixel 11c and a vacant space of the adjacent fifth pixel 11e. Note that the vacant space is the space where the microlens is not formed on the lens forming surface 34a of the pixel.

Similarly, the third pixel 11c has a microlens 54 having a diameter larger than that of the microlens 21c of the first and second embodiments. The microlens 54 is formed so that parts of it get into a vacant space of the adjacent second pixel 11b and a vacant space of the adjacent fifth pixel 11e.

In each of the second pixel 11b and the third pixel 11c which is phase difference detection pixel, since it is necessary to shift the center of the light receiving surface of the each PD 20b, 20c from the optical axis of the each microlens 53, 54, the each microlens 53, 54 must be smaller than that of the dedicated imaging pixel. Accordingly, in the second pixel 11b and the third pixel 11c, since an light receiving amount becomes lower than that of the dedicated imaging pixel, when the autofocus of the phase difference method is executed and an image consisting of image signal of these each pixel is formed, there become problems that noise is left and a false color is occurred even after image processing.

In contrast, in this embodiment, by getting the microlenses 53 and 54 of the second and third pixels 11b and 11c into the vacant spaces of the adjacent pixels, the diameter is made as large as possible. Accordingly, the light receiving amount of the second pixel 11b and the third pixel 11c increases, and occurrence of the noise and the false color is reduced.

Fourth Embodiment

Figure 6:
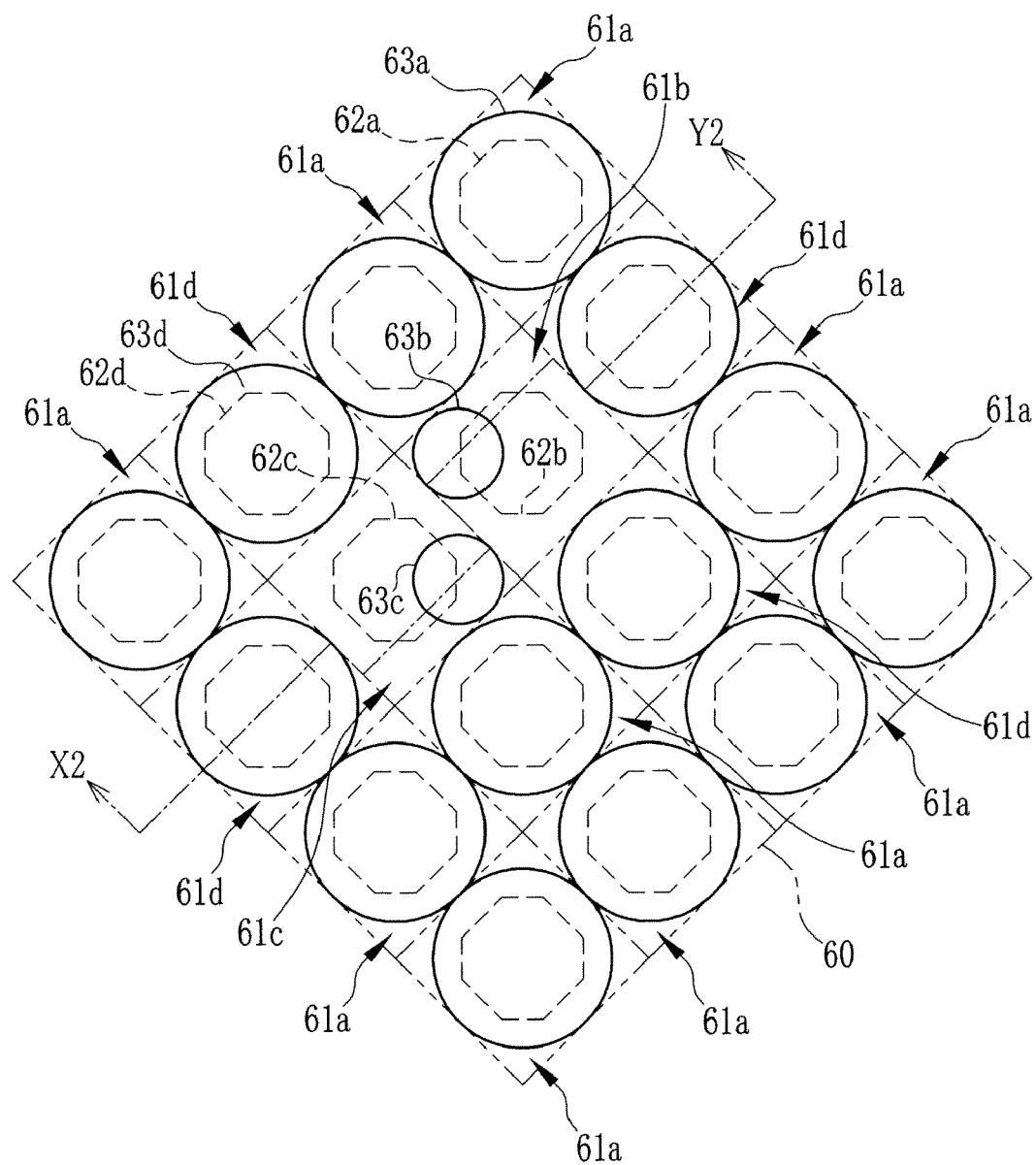
FIG. 6 is an explanatory diagram showing a constitution of the pixel group when a height of a microlens of the dedicated imaging pixel adjacent to the phase difference detection pixel is lowered.

Next, a fourth embodiment of the present invention will be explained. In FIG. 6, like the pixel group 18 of the first embodiment described above, a pixel group 60 of this embodiment is comprised of four kinds of pixels which are a first pixel 61a, a second pixel 61b, a third pixel 61c and a fourth pixel 61d. The each pixel 61a to 61d comprises each PD 62a to 62d and each microlens 63a to 63d. Among these pixels 61a to 61d, the first pixel 61a to the third pixel 61c have the constitution same as the first pixel 11a to the third pixel 11c of the first embodiment.

Figure 7:
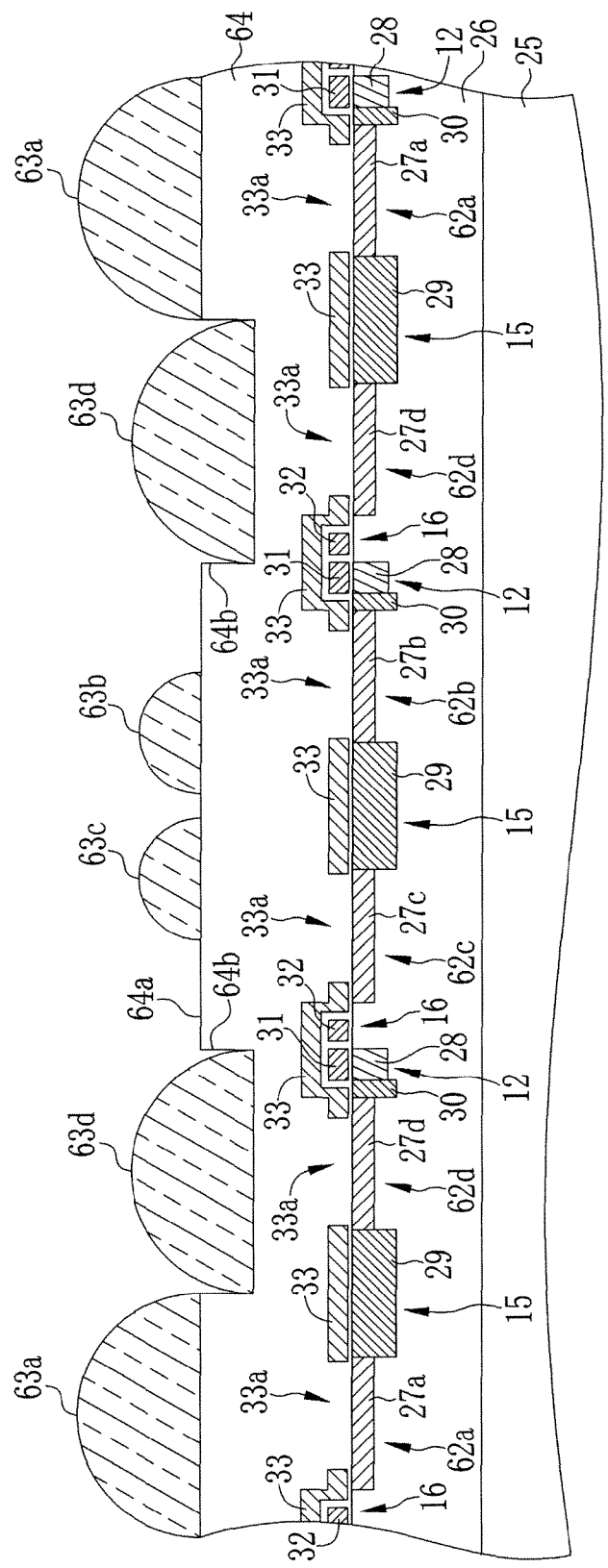
FIG. 7 is a partial cross-sectional view showing a constitution of each pixel when the height of the microlens of the dedicated imaging pixel adjacent to the phase difference detection pixel is lowered.

On the other hand, unlike the fourth pixel 11d of the first embodiment, the fourth pixel 61d has the microlens 63d which has approximately the same shape and size as the microlens 63a of the first pixel 61a. As illustrated in FIG. 7 which illustrates a section of a cutting-plane line X2-Y2, on a lens forming surface 64a of a planarizing layer 64, a concave section 64b is formed at the point corresponding to the fourth pixel 61d. The microlens 63d of the fourth pixel 61d is formed on an inner bottom surface of the concave section 64b, and has a height from the PD 62d which is lower than that of the each microlens 63a to 63c of each of the first pixel 61a to the third pixel 61c which was formed on the lens forming surface 64a.

The microlens 63a of the first pixel 61a has a light-condensing property to let condensed light be appropriately incident on the PD 62a at a position on the lens forming surface 64a. Since the microlens 63d of the fourth pixel 61d is formed at the position lower than the lens forming surface 64a although having the light-condensing property which is the same as that of the microlens 63a of the first pixel 61a, light that condensed in an outer peripheral portion is not incident on the PD 62d (so-called vignetting occurs), and quantity of the light to be incident on the PD 62d decreases.

Accordingly, since a depth of the concave section 64b, namely the height of the microlens 63d from the PD 62d is regulated so that quantity of the light to be incident on the PD 62d is lowered corresponding to quantity of light incident from a gap occurring between the microlens 63b and the microlens 63d or a gap occurring between the microlens 63c and the microlens 63d, the effect like the first embodiment can be obtained.

Fifth Embodiment

Figure 8:
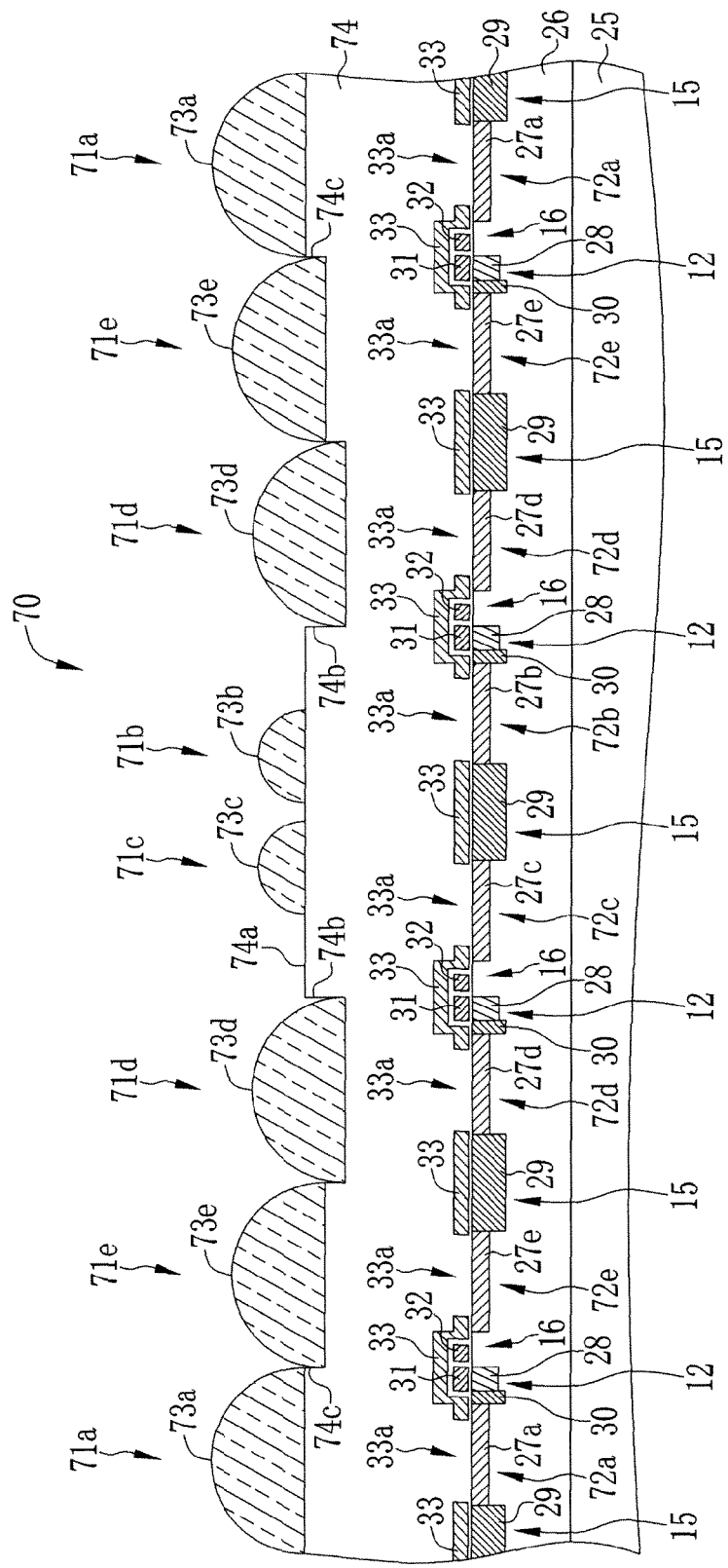
FIG. 8 is a partial cross-sectional view showing an example in which a height of a microlens of the dedicated imaging pixel around the phase difference detection pixel is lowered progressively.

Next, a fifth embodiment of the present invention will be explained. In FIG. 8, like the pixel group 50 of the second embodiment described above, a pixel group 70 of this embodiment is comprised of five kinds of pixels which are a first pixel 71a to a fifth pixel 71e. The each pixel 71a to 71e comprises each PD 72a to 72e and each microlens 73a to 73e. Among these pixels 71a to 71e, the first pixel 71a to the fourth pixel 71d have the constitution same as the first pixel 61a to the fourth pixel 61d of the fourth embodiment. The fifth pixel 71e has the microlens 73e which has approximately the same shape and size as the each microlens 73a, 73d of each of the first pixel 71a and the fourth pixel 71d.

On a lens forming surface 74a of a planarizing layer 74, a first concave section 74b is formed at the point corresponding to the fourth pixel 71d, and a second concave section 74c is formed at the point corresponding to the fifth pixel 71e. The second concave section 74c is formed to become more shallow than the first concave section 74b. The microlens 73d of the fourth pixel 71d is formed in an inner bottom surface of the first concave section 74b. The microlens 73e of the fifth pixel 71e is formed in an inner bottom surface of the second concave section 74c.

In the fourth embodiment, only the microlens 63d of the fourth pixel 61d is formed in the low position. In contrast, in this embodiment, by forming the first concave section 74b and the second concave section 74c having different heights, the microlens 73d of the fourth pixel 71d and the microlens 73e of the fifth pixel 71e are lowered to have different heights. Concretely, the height of the microlens of the pixel around the phase difference detection pixels (the second pixel 71b and the third pixel 71c) is progressively lowered as being closer to the phase difference detection pixel. Accordingly, like the second embodiment, light of uniform quantity is incident on the PD of the dedicated imaging pixel, and an image with few noises can be obtained.

سixth Embodiment

Figure 9:
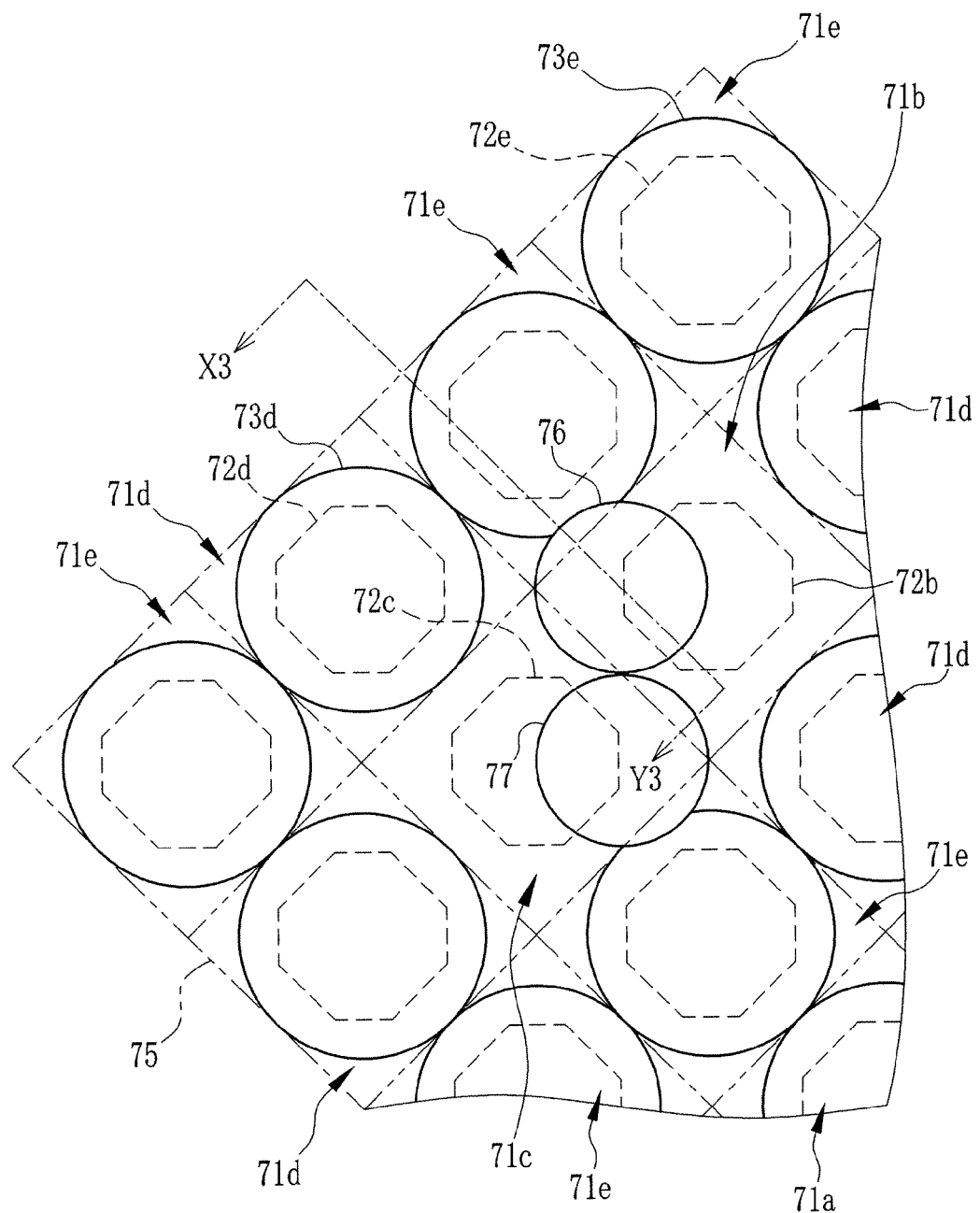
FIG. 9 is an explanatory diagram showing a constitution of the pixel group when a microlens of the phase difference detection pixel is made large as much as possible after having lowered a microlens of the neighboring dedicated imaging pixel.

Next, a sixth embodiment of the present invention will be explained. In FIG. 9, like the pixel group 70 of the fifth embodiment described above, a pixel group 75 of this embodiment is comprised of five kinds of pixels which are a first pixel 71a to a fifth pixel 71e. Of these, the first pixel 71a, the fourth pixel 71d and the fifth pixel 71e which are the dedicated imaging pixels have the same constitution as the fifth embodiment.

On the other hand, the second pixel 71b has a microlens 76 having a diameter larger than that of the microlens 73b of the fifth embodiment. The microlens 76 is disposed so that a part of it gets into a vacant space of the adjacent third pixel 71c, and another part gets into a vacant space of the adjacent fifth pixel 71e and a part of it is overlapped with the microlens 73e of the fifth pixel 71e in the optical axis direction (the height direction).

Figure 10:
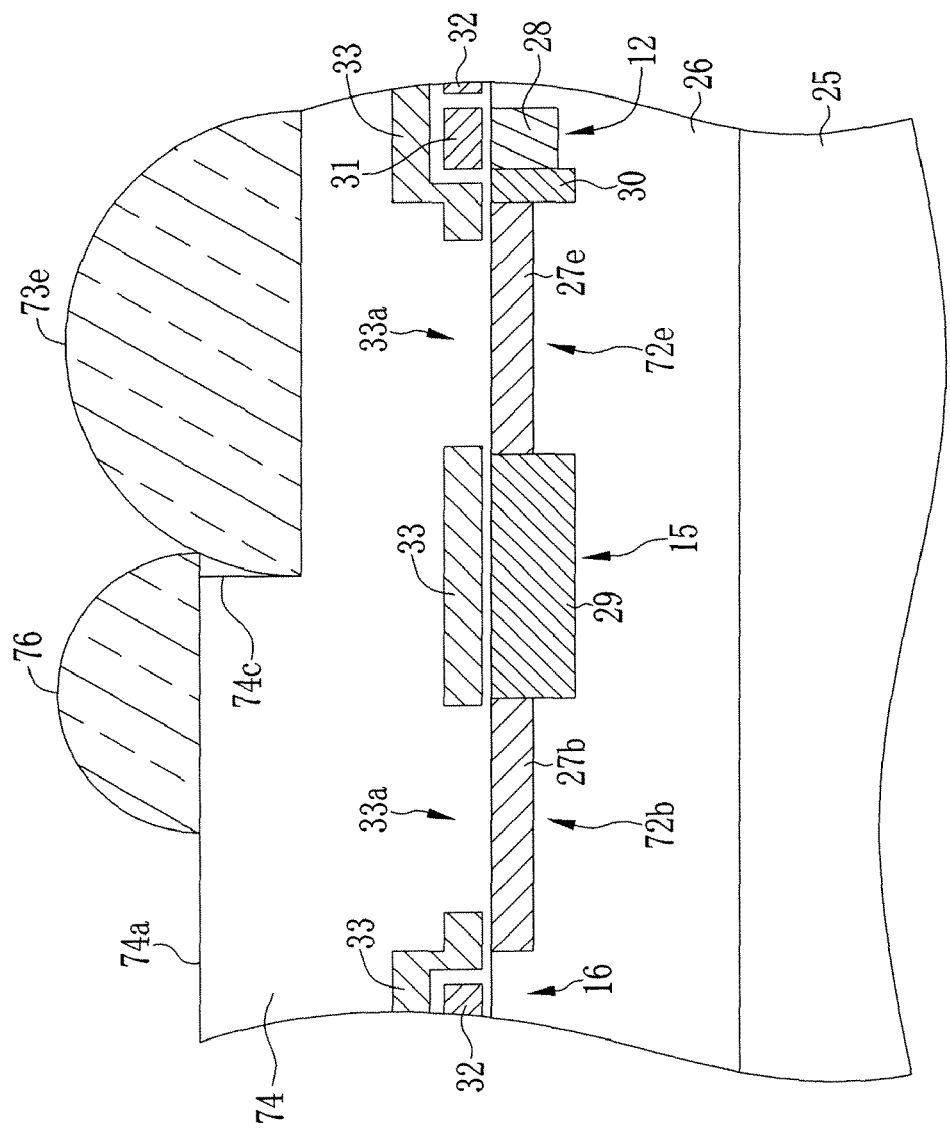
FIG. 10 is partial cross-sectional view showing the constitution of each pixel when the microlens of the phase difference detection pixel is made large as much as possible after having lowered the microlens of the neighboring dedicated imaging pixel schematically.

In FIG. 10 which illustrates a section of a cutting-plane line X3-Y3, the microlens 73e of the fifth pixel 71e is formed on the inner bottom surface of the second concave section 74c. Since the microlens 73e of the fifth pixel 71e has a height from the PD 72e which is lower than that of the microlens 76 of the second pixel 71b, a space occurs in the lateral side of the microlens 76 according to curvature of the microlens 73e. In this embodiment, a diameter of the microlens 76 becomes as large as possible by letting a part of the microlens 76 get into this space.

Similarly, the third pixel 71c has a microlens 77 having a diameter larger than that of the microlens 73c of the fifth embodiment. The microlens 77 is disposed so that a part of it gets into a vacant space of the adjacent second pixel 71c, and another part gets into a vacant space of the adjacent fifth pixel 71e and a part of it is overlapped with the microlens 73e of the fifth pixel 71e in the optical axis direction (the height direction).

As described above, as same as the third embodiment, since the microlenses 76 and 77 are made as large as possible, the light receiving amount of the second pixel 71b and the third pixel 71c increases, and occurrence of the noise and the false color is reduced.

Seventh Embodiment

Figure 11:
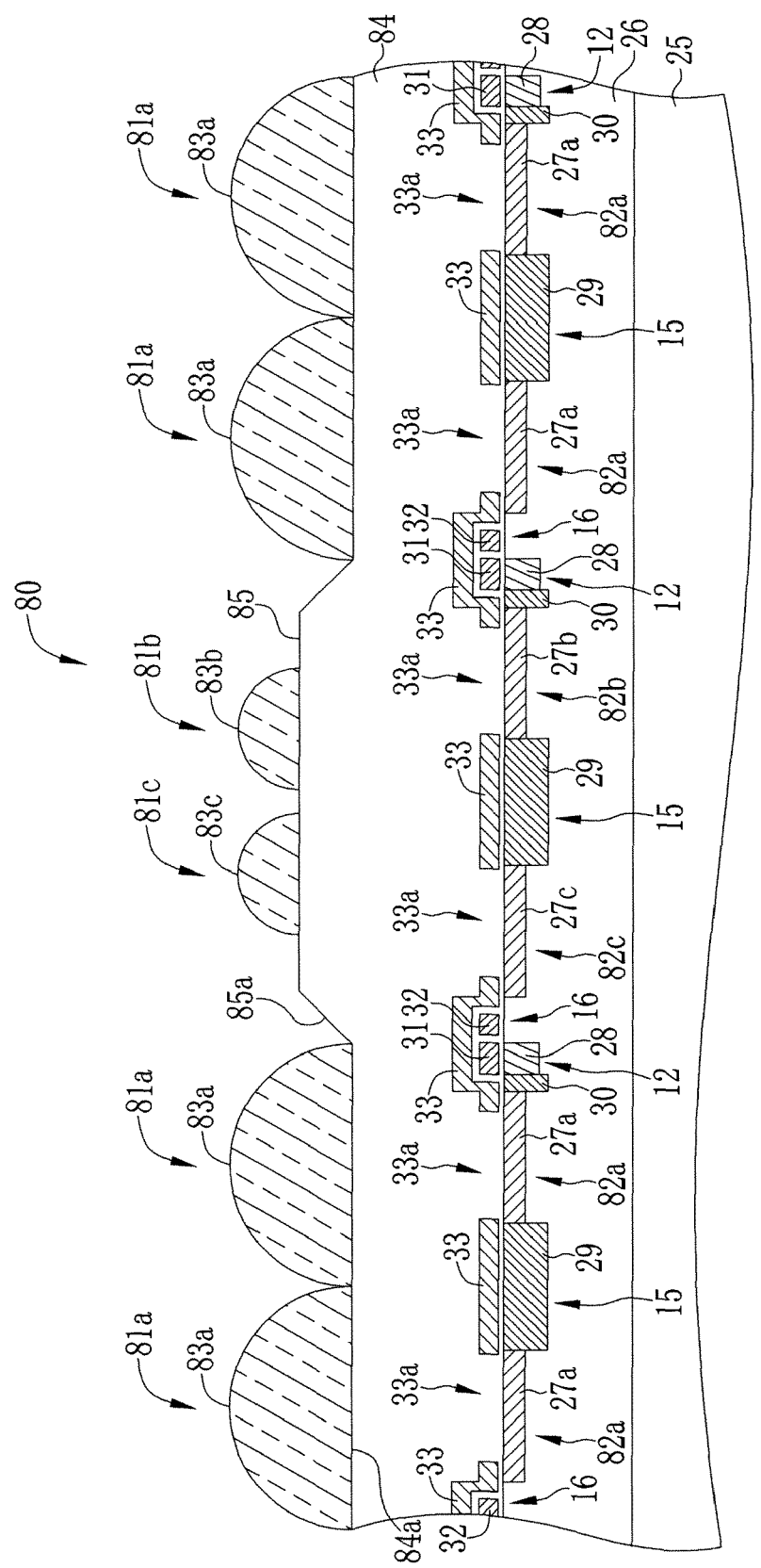
FIG. 11 is a partial cross-sectional view showing an example in which a height of a microlens of the phase difference detection pixel is made higher.

Next, a seventh embodiment of the present invention will be explained. In FIG. 11, a pixel group 80 of this embodiment is comprised of three kinds of pixels which are a first pixel 81a which is the dedicated imaging pixel, and a second pixel 81b and a third pixel 81c which are the phase difference detection pixels. The each pixel 81a to 81c includes each PD 82a to 82c and each microlens 83a to 83c, which are composed as same as the each embodiment described above.

A convex section 85 is formed on a lens forming surface 84a of a planarizing layer 84 at a position corresponding to each of the second pixel 81b and the third pixel 81c. The convex section 85 is formed in an approximately frustum of quadrangular pyramid shape, which is each rectangular area of the second pixel 81b and the third pixel 81c protruded predetermined quantity from the lens forming surface 84a. A slope 85a sloping towards a border part with the adjacent first pixel 81a is formed as the circumference of the convex section 85.

The microlens 83b, 83c of the second pixel 81b and the third pixel 81c are formed on the convex section 85, and have a height from the PD 82b, 82c which is higher than that of the microlens 83a of the first pixel 81a.

As described above, by making the height of the microlenses 83b and 83c higher, an incident angle range of light to be incident on the PD 82a of the first pixel 81a through a gap with the adjacent first pixel 81a becomes narrower. Accordingly, since the light becomes hard to be incident from the gap between the microlens 83a and the microlens 83b and the gap between the microlens 83a and the microlens 83c, an increase of the light receiving amount of the first pixel 81a occurred by the incident light from the gap is reduced. In addition, the incident angle range mentioned above becomes narrower by making the slope 85a as the circumference of the convex section 85.

By the way, as factors of the increase of the light receiving amount of the dedicated imaging pixel adjacent to the phase difference detection pixel, there is a factor due to production, in addition to the above-described factor, that is, the PD of the dedicated imaging pixel receives the light incident from the gap occurring between the microlenses. Specifically, when the microlens of the dedicated imaging pixel is formed, since the dedicated imaging pixel adjacent to the phase difference detection pixel becomes to have the microlens spreads towards the gap with the microlens of the phase difference detection pixel, whose size becomes larger than the microlens of other dedicated imaging pixel, and the light receiving amount increases.

For this problem, in this embodiment, since the slope 85a of the convex section 85 acts as an obstacle to prevent that the microlens 83a of the first pixel 81a adjacent to the second pixel 81b and the third pixel 81c spreads to be larger when the each microlens 83a of the first pixel 81a which is dedicated imaging pixel is formed, the light quantity increase due to production is prevented.

Note that the inclination angle of the slope 85a may be any angle in consideration of a molding property of the microlens 83a, the convex section 85 and so on. In addition, the slope 85a may be the perpendicular plane which is approximately perpendicular to the lens forming surface 84a.

Eighth Embodiment

Figure 12:
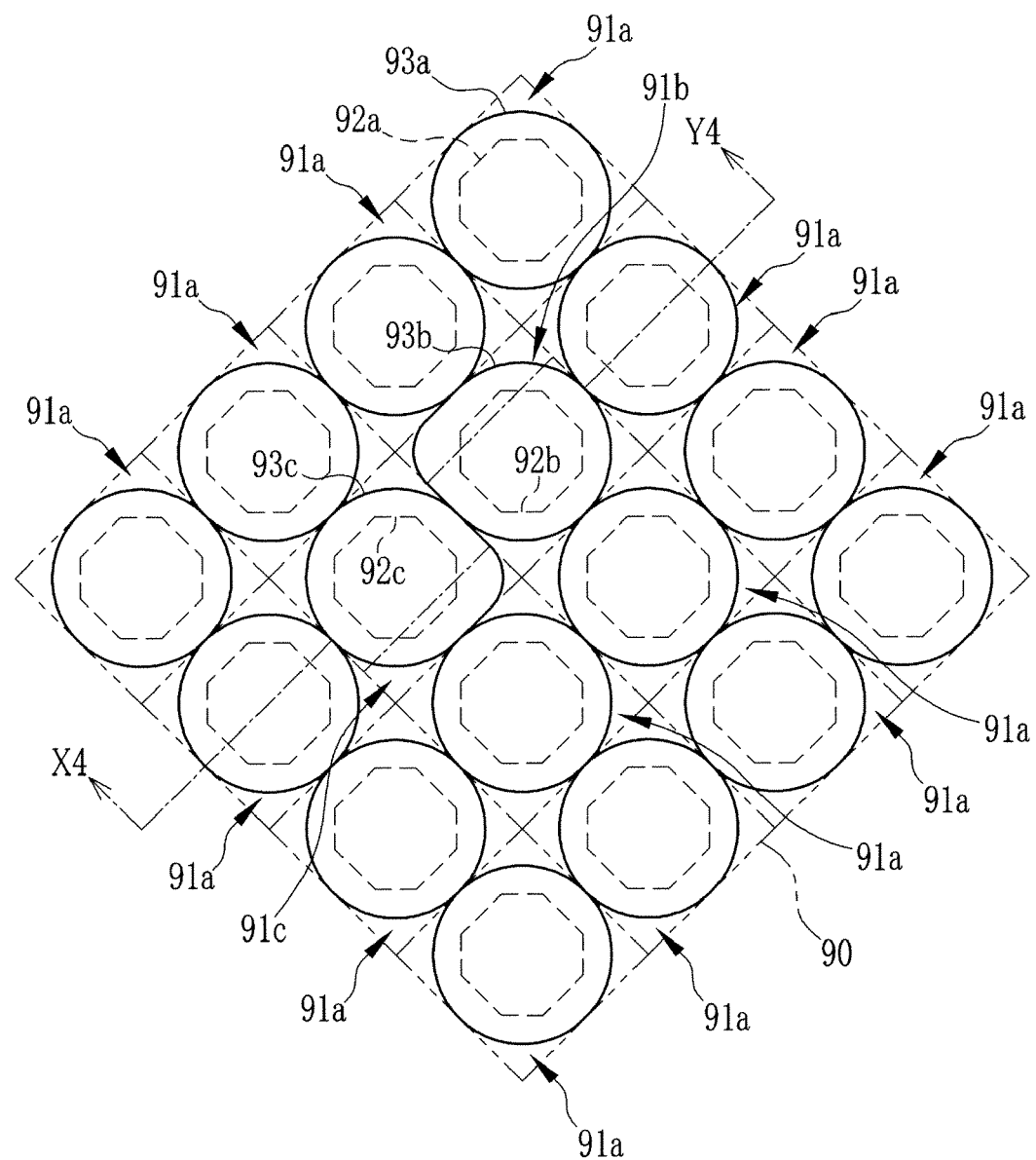
FIG. 12 is an explanatory diagram showing a constitution of the pixel group when a microlens of the phase difference detection pixel is made to a nonspherical shape.

Next, an eighth embodiment of the present invention will be explained. In FIG. 12, a pixel group 90 of this embodiment is comprised of three kinds of pixels which are a first pixel 91a which is the dedicated imaging pixel, and a second pixel 91b and a third pixel 91c which are the phase difference detection pixels. The first pixel 91a includes a PD 92a and a microlens 93a, which are composed as same as the each embodiment described above. Each of the second pixel 91b and the third pixel 91c includes each PD 92a, 92c and each microlens 93b, 93c. The PD 92b, 92c are composed as same as the each embodiment described above.

Figure 13:
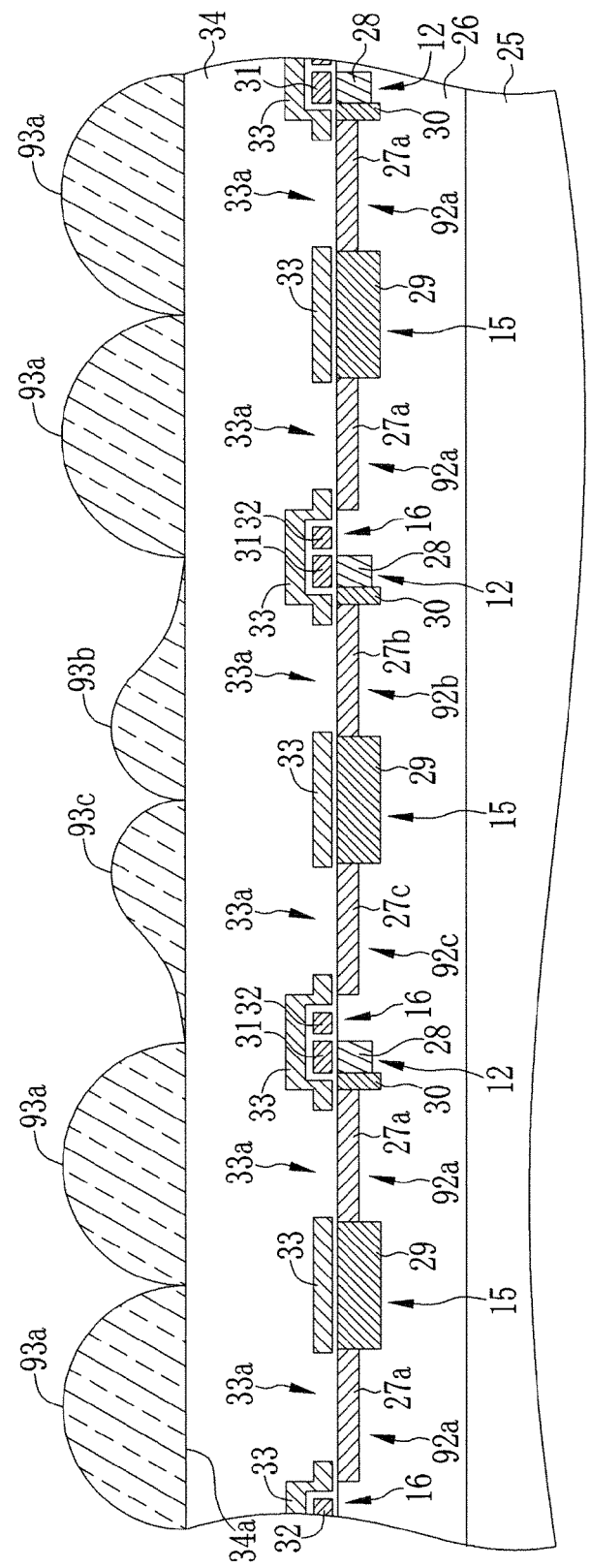
FIG. 13 is a partial cross-sectional view showing a constitution of each pixel when the microlens of the phase difference detection pixel is made to the nonspherical shape.

In FIG. 12, and in FIG. 13 illustrating a section of a cutting-plane line X4-Y4, the microlens 93b of the second pixel 91b has a nonspherical shape in which its optical axis center is shifted leftward predetermined amount from the center of the light receiving surface of the PD 92b, and its bottom portion contacting the lens forming surface 34a is extended towards a border part with the adjacent first pixel 91a. Similarly, the microlens 93c of the third pixel 91c has a nonspherical shape in which its optical axis center is shifted rightward predetermined amount from the center of the light receiving surface of the PD 92c, and its bottom portion contacting the lens forming surface 34a is extended towards a border part with the adjacent first pixel 91a.

As described above, by making the microlenses 93b, 93c the nonspherical shape, it can prevent a gap from occurring between the each microlens 93b, 93c and the adjacent microlens 93a. Accordingly, in this embodiment, the light receiving amount of the adjacent first pixel 91a does not increase by receiving incident light from the gap mentioned above and enlarging the microlens 93a at the time of lens molding. In addition, since the size of the each microlens 93b, 93c becomes large according to the bottom portion, the light receiving amount of each of the second pixel 91b and the third pixel 91c increases. Note that as a formation method of the microlens of the nonspherical shape, for example, a method listed in Japanese Patent Laid-Open Publication No. 2006-049721 can be used.

Ninth Embodiment

Figure 14:
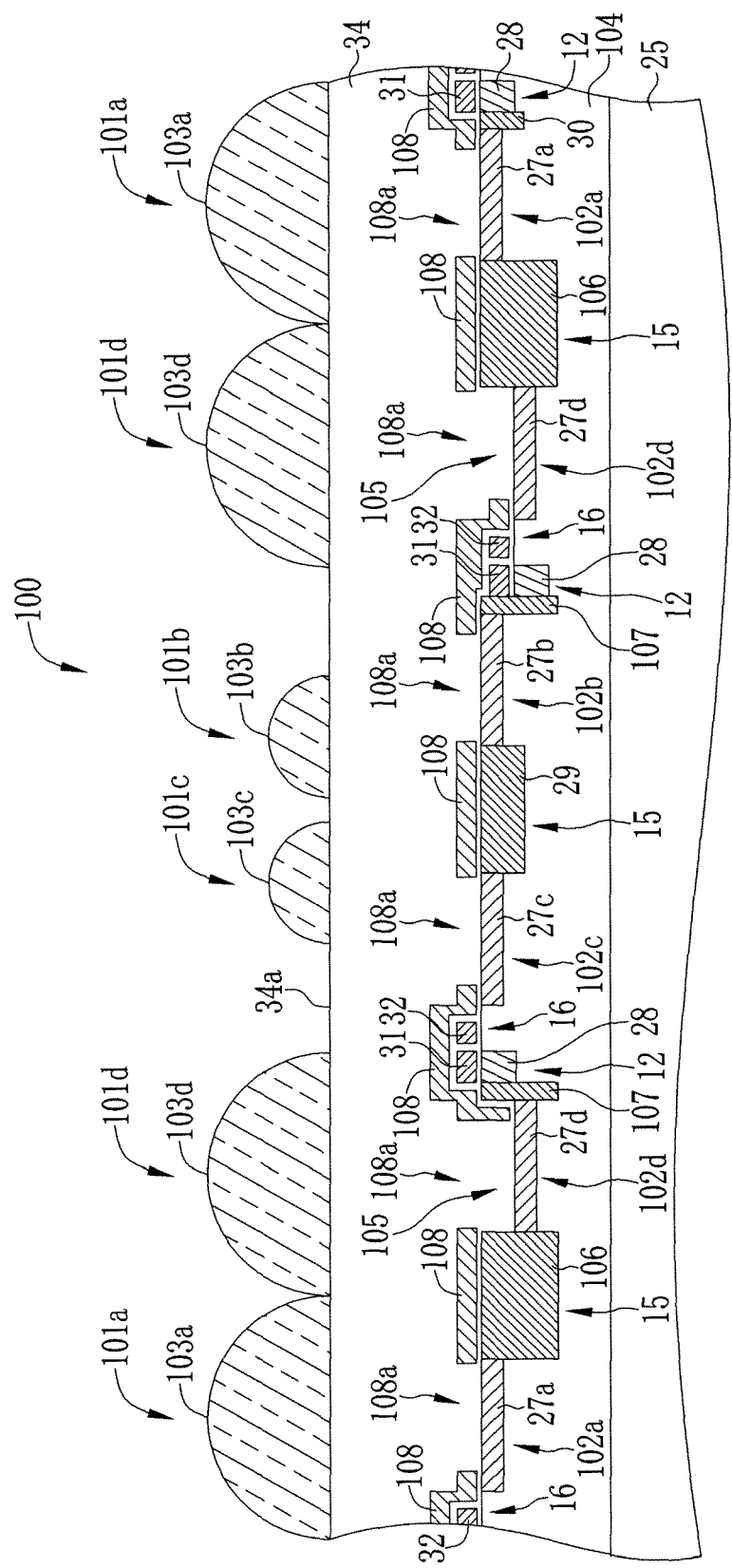
FIG. 14 is a partial cross-sectional view showing an example in which a height of a PD of the dedicated imaging pixel adjacent to the phase difference detection pixel is lowered.

Next, a ninth embodiment of the present invention will be explained. As illustrated In FIG. 14, a pixel group 100 of this embodiment is comprised of four kinds of pixels which are a first pixel 101a, a second pixel 101b, a third pixel 101c and a fourth pixel 101d. The each pixel 101a to 101d includes each PD 102a to 102d and each microlens 103a to 103d. The each microlens 103a to 103d has the same constitution as the each microlens 63a to 63d of the fourth embodiment mentioned above.

Figure 15:
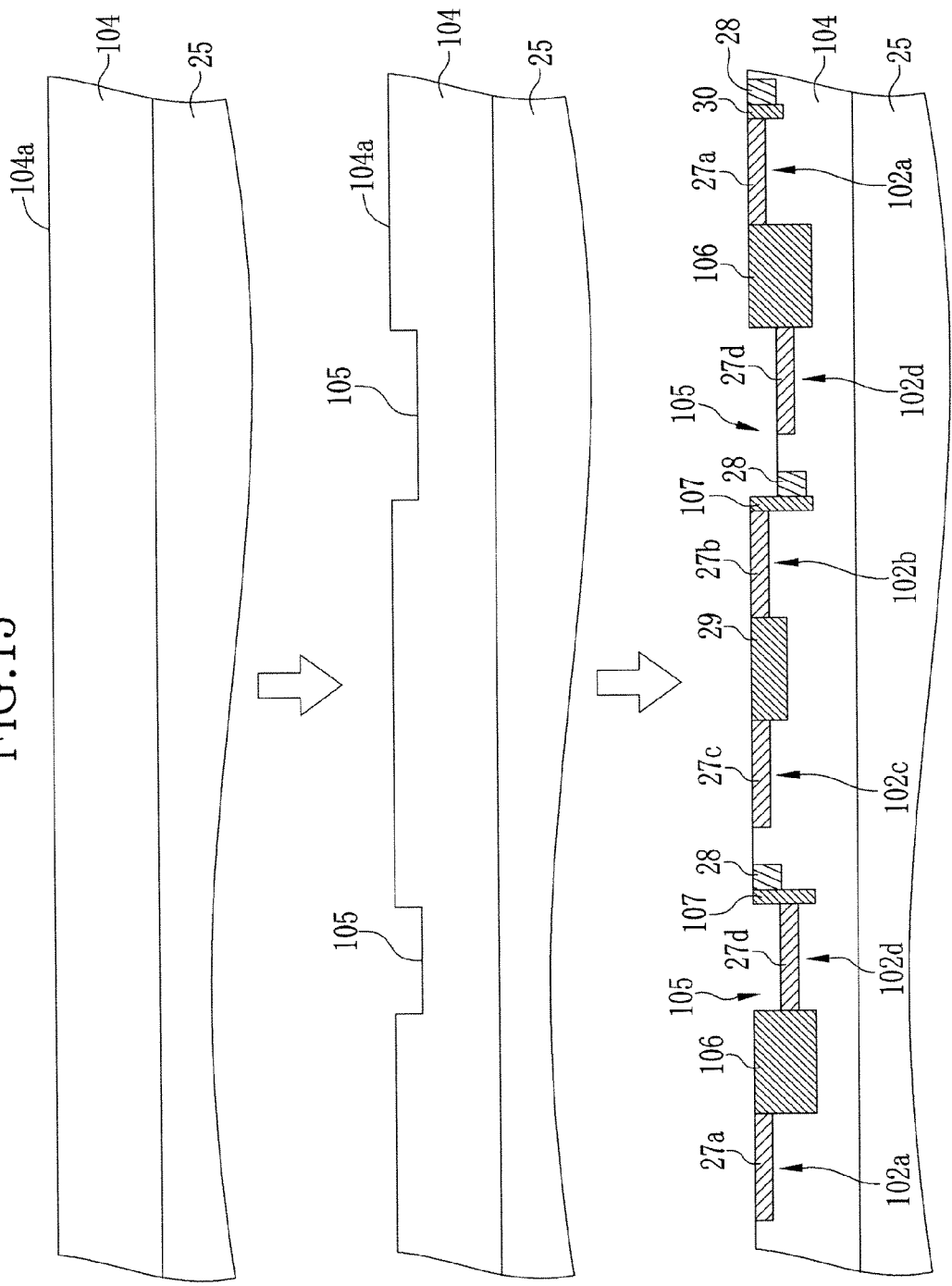
FIG. 15 is an explanatory diagram showing a production procedure when the height of the PD of the dedicated imaging pixel adjacent to the phase difference detection pixel is lowered.

On a surface 104a of a p-well layer 104, a concave section 105 is formed at a position corresponding to the fourth pixel 101d. The concave section 105 is formed by, as illustrated in FIG. 15, etching of the surface 104a of the p-well layer 104 using a well-known lithography technique or etching technique.

Among the PDs 102a to 102d, the PDs 102a to 102c are formed on the surface 104a of the p-well layer 104. On the other hand, the PD 102d is formed on an inner bottom surface of the concave section 105. Accordingly, the PD 102d comes to have a lower height on the n type semiconductor substrate 25 than the other PDs 102a to 102c.

On the concave section 105, also the VCCD 12 corresponding to the PD 102d, and the readout gate 16 are formed. These parts are composed after forming the concave section 105 on the p-well layer 104, by forming the n-type layers 27a to 27d, 28 and p+ layers 29, 30, 106, 107 with using a well-known lithography technique or doping technique at predetermined positions. The p+ layers 106, 107 to prevent transfer of electric charge accumulated in the PD 102d are formed more deeply than the p+ layer 29, 30 corresponding to the concave section 105. In addition, on the surface 104a of the p-well layer 104, like the each embodiment described above, a light shielding film 108, which covers the transfer electrodes 31, 32 and has a plurality of openings 108a exposing the each n-type layer 27a to 27d, is formed.

As described above, since the height of the PD 102d is lowered than that of the each PD 102a to 102c, by a rim of the concave section 105, and structures such as the transfer electrodes 31, 32 and the light shielding film 108 provided on the surface 104a of the p-well layer 104 at positions close to this rim, incident light from the gap occurring between the microlens 103b and the microlens 103d or the gap occurring between the microlens 103c and the microlens 103d is shielded to hardly enter the PD 102d. Accordingly, it is prevented that an increase of light receiving amount of the fourth pixel 101d due to incident light from the gap mentioned above, and light of approximately uniform quantity is incident on the each PD 102a, 102d of each of the first pixel 101a and the fourth pixel 101d which are the dedicated imaging pixel.

Tenth Embodiment

Figure 16:
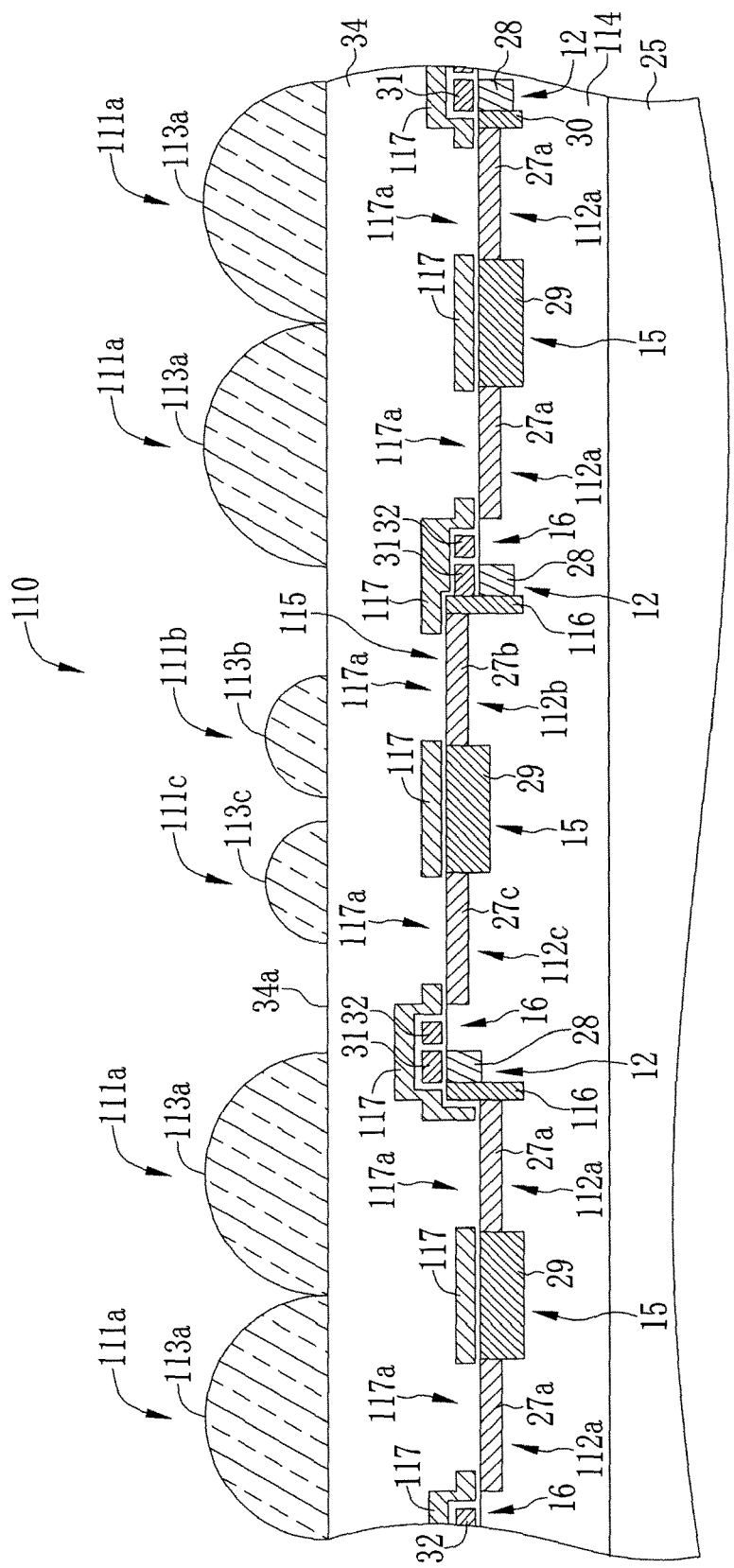
FIG. 16 is a partial cross-sectional view showing an example in which a height of a PD of the phase difference detection pixel is made higher.

Next, a tenth embodiment of the present invention will be explained. In FIG. 16, a pixel group 110 of this embodiment is comprised of three kinds of pixels which are a first pixel 111a, a second pixel 111b and a third pixel 101c. The each pixel 111a to 111c includes each PD 112a to 112c and each microlens 113a to 113c. The each microlens 113a to 113c has the same constitution as the each embodiment mentioned above.

Figure 17:
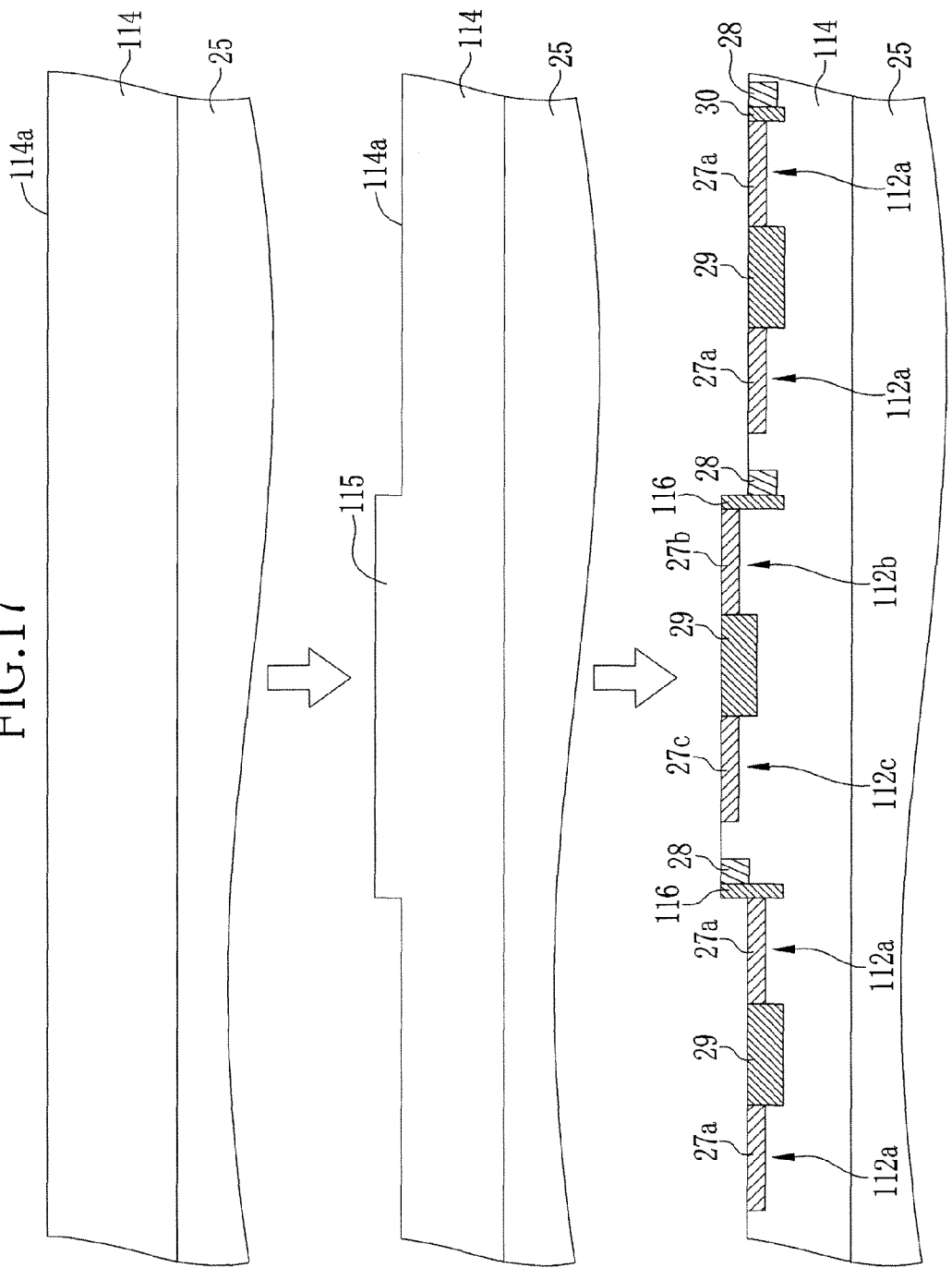
FIG. 17 is an explanatory diagram showing a production procedure when the height of the PD of the phase difference detection pixel is made higher.

On a surface 114a of a p-well layer 114, a convex section 115 is formed at a position corresponding to the third pixel 111c. The convex section 115 is formed by, as illustrated in FIG. 17, etching of the surface 114a of the p-well layer 114 using a well-known lithography technique or etching technique.

Among the PDs 112a to 112c, the PDs 112a is formed on the surface 114a of the p-well layer 114. On the other hand, the PDs 112b, 112c are formed on an inner bottom surface of the convex section 115. Accordingly, the each PD 112b, 112c comes to have a higher height on the n type semiconductor substrate 25 than the PD 112a.

On the convex section 115, also the VCCD 12 corresponding to the PDs 112b, 112c, and the readout gate 16 are formed. These parts are composed after forming the convex section 115 on the p-well layer 114, by forming the n-type layers 27a to 27c, 28 and p+ layers 29, 30, 116 with using a well-known lithography technique or doping technique at predetermined positions. The p+ layer 116 to partition the PDs 112b, 112c from the adjacent PD 112a is formed more deeply than the p+ layer 30 corresponding to the convex section 115. In addition, on the surface 114a of the p-well layer 114, like the each embodiment described above, a light shielding film 117, which covers the transfer electrodes 31, 32 and has a plurality of openings 117a exposing the each n-type layer 27a to 27c, is formed.

As described above, since the height of the PD 112b, 112c are made to be higher than that of the PD 112a, by a corner of the convex section 115, and structures such as the transfer electrodes 31, 32 and the light shielding film 117 provided at positions close to this corner, incident light from the gap occurring between the microlens 113a and the microlens 113b or the gap occurring between the microlens 113a and the microlens 113c is shielded to hardly enter the PD 112a. Accordingly, it is prevented that an increase of light receiving amount of the adjacent first pixel 111a due to incident light from the gap mentioned above, and light of approximately uniform quantity is incident on the PD 112a of the first pixel 111a which is the dedicated imaging pixel.

In addition, by providing the PD 112b, 112c on the convex section 115, the each PD 112b, 112c becomes close to the each microlens 113b, 113c, and occurrence of vignatting is suppressed. Accordingly, light receiving amount of each of the second pixel 111b and the third pixel 111c increases.

Figure 18:
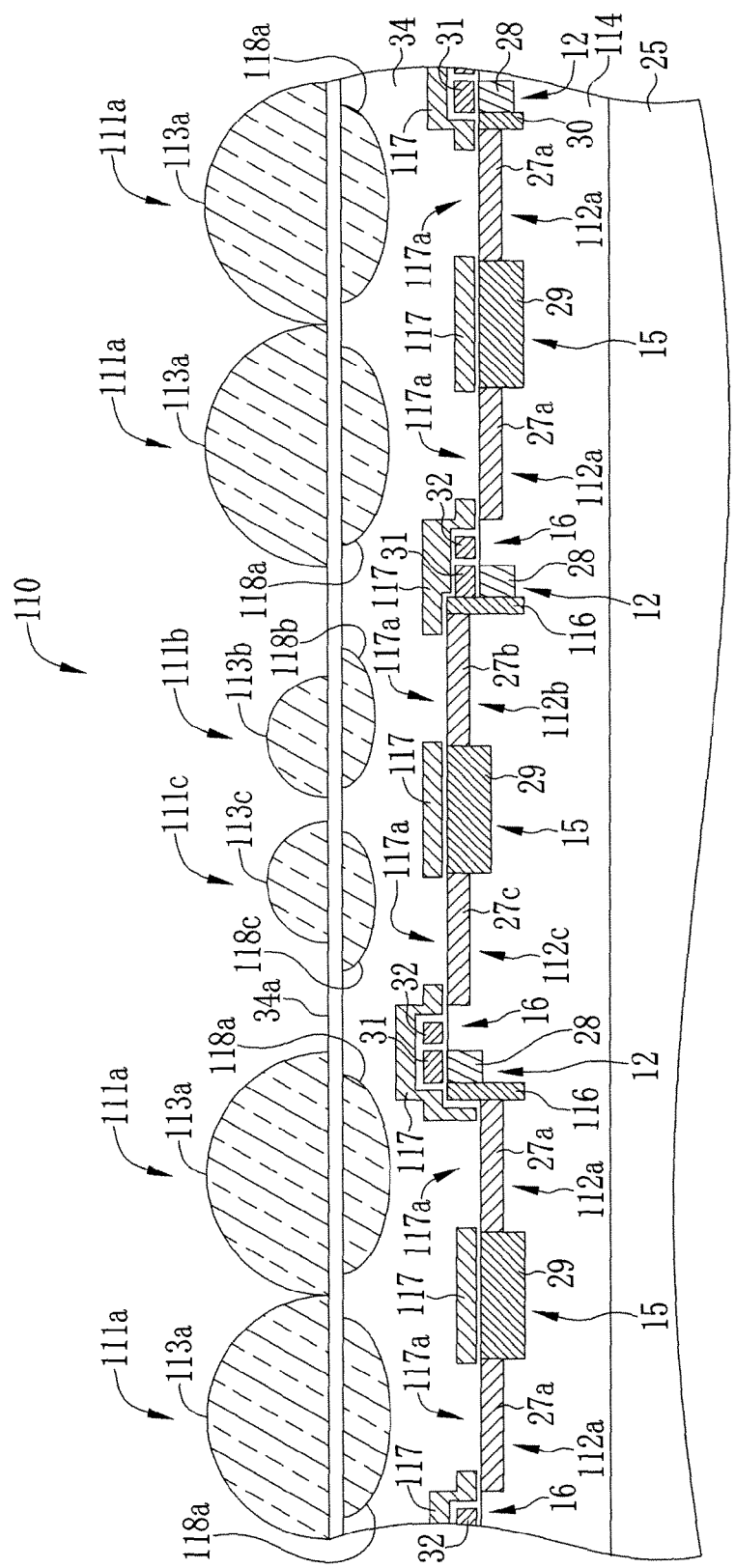
FIG. 18 is a partial cross-sectional view showing an example in which an inner lens for each pixel is made.

Note that as illustrated in FIG. 18, it is also preferable to make each inner lens 118a to 118c for the each pixel 111a to 111c. In this case, it is more preferable that a shape of the inner lens 118a is different from a shape of the each inner lens 118b, 118c.

When all the inner lenses 118a to 118c are formed to the same shape, it is thought that a focal shift occurs in either between the first pixel 111a and the second pixel 111b or the third pixel 111c by a difference of the height among the PDs 112a to 112c, and light receiving efficiency of the concerned pixel deteriorates. In contrast, by changing a shape of inner lens 118a from that of the each inner lens 118b, 118c according to the height of the each PD 112a to 112c, a focus of the each inner lens 118a to 118c appropriately matches for the each PD 112a to 112c. Accordingly, deterioration of light receiving efficiency due to the focal shift is prevented.

Eleventh Embodiment

Figure 19:
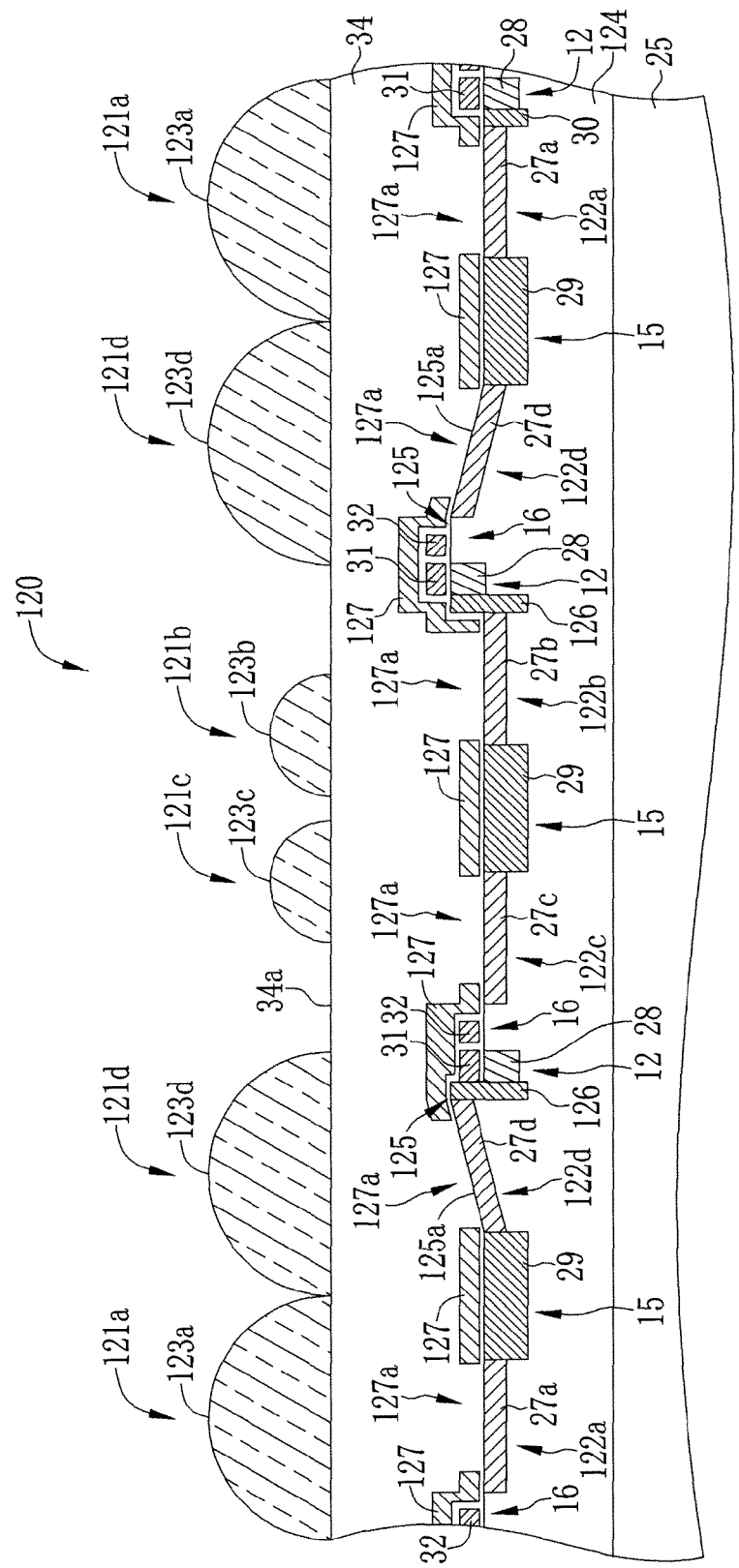
FIG. 19 is a partial cross-sectional view showing an example in which a PD of the dedicated imaging pixel adjacent to the phase difference detection pixel is inclined.

Next, an eleventh embodiment of the present invention will be explained. As illustrated In FIG. 19, a pixel group 120 of this embodiment is comprised of four kinds of pixels which are a first pixel 121a, a second pixel 121b, a third pixel 121c and a fourth pixel 121d. The each pixel 121a to 121d includes each PD 122a to 122d and each microlens 123a to 123d. The each microlens 123a to 123d has the same constitution as the each microlens 103a to 103d of the ninth embodiment mentioned above.

Figure 20:
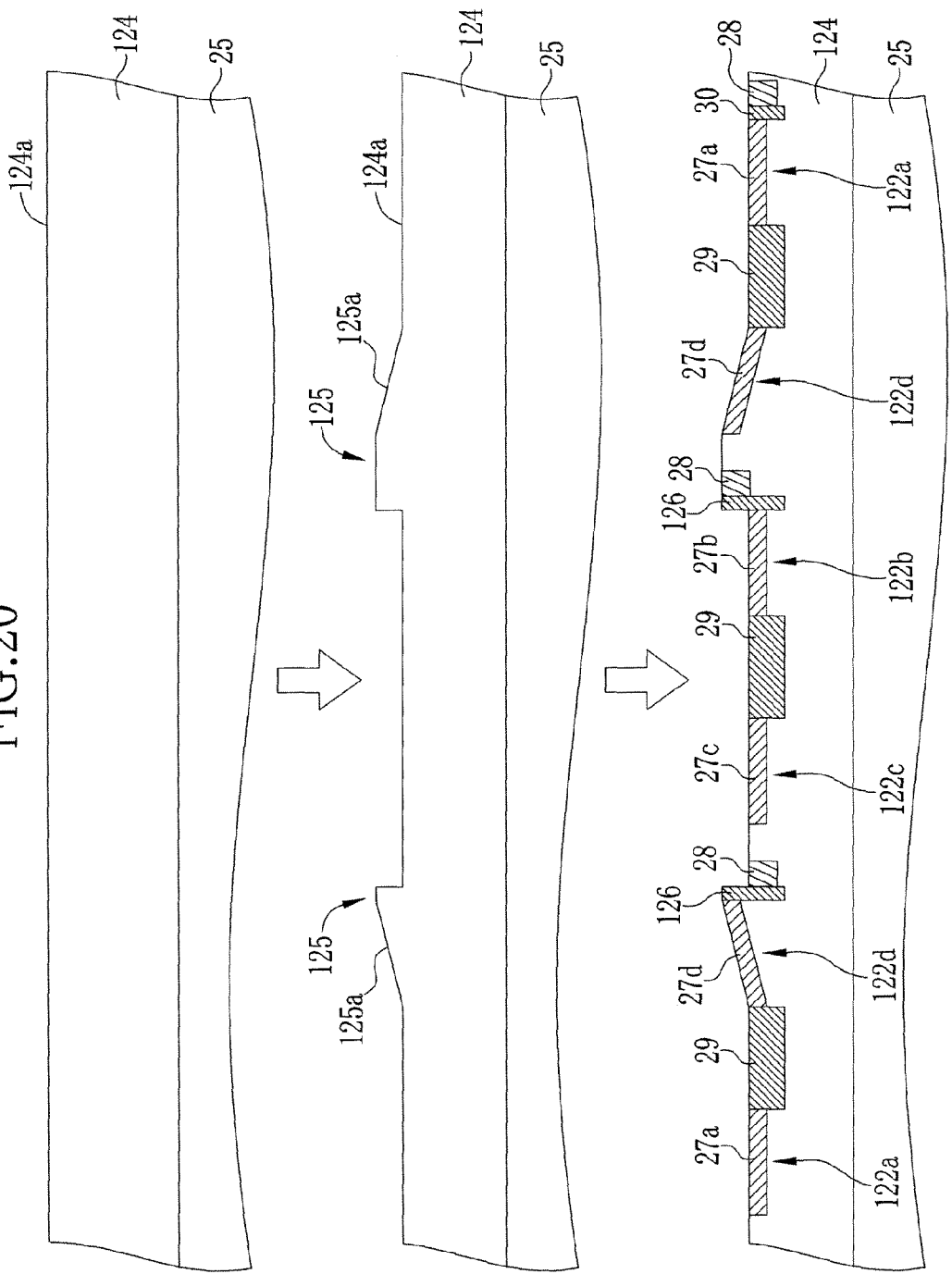
FIG. 20 is an explanatory diagram showing a production procedure when the PD of the dedicated imaging pixel adjacent to the phase difference detection pixel is inclined.

As illustrated in FIG. 20, on a surface 124a of a p-well layer 124, a convex section 125 is formed at a position corresponding to the fourth pixel 121d. The convex section 125 is formed in a shape of a prism having the section of an approximately trapezoid, and has a slope 125a which is slanted a predetermined angle from the surface 124a of the p-well layer 124. In addition, the convex section 125 is formed so that the slope 125a faces a direction opposite to the adjacent second pixel 121b or the third pixel 121c.

The convex section 125 having the such slope 125a can be formed by for example a gray scale lithography technique in which light quantity to arrive at a photosensitive material is controlled by changing quantity of transmission of ultraviolet rays with use of a photomask (gray scale mask) having variable density.

Specifically, the photosensitive material having a shape corresponding to the convex section 125 is formed on the p-well layer 124 by the gray scale lithography. After that, by applying anisotropic etching to the p-well layer 124, the shape of the photosensitive material is copied to the p-well layer 124. Accordingly, the convex section 125 having the slope 125a is formed on the surface 124a of the p-well layer 124.

Among the PDs 122a to 122d, the PDs 122a to 122c are formed on the surface 124a of the p-well layer 124. On the other hand, the PD 122d is formed on the slope 125a of the convex section 125. The PD 122d inclines so that the light receiving surface faces a direction opposite to the adjacent second pixel 121b or the third pixel 121c.

On the convex section 125, also the VCCD 12 corresponding to the PD 122d, and the readout gate 16 are formed. These parts are composed after forming the convex section 125 on the p-well layer 124, by forming the n-type layers 27a to 27d, 28 and p+ layers 29, 30, 126 with using a well-known lithography technique or doping technique at predetermined positions. The p+ layer 126 to partition the PD 122b from the PD 122d, and partition the PD 122c from the PD 122d is formed more deeply than the p+ layer 30 corresponding to the convex section 125. In addition, on the surface 124a of the p-well layer 124, like the each embodiment described above, a light shielding film 127, which covers the transfer electrodes 31, 32 and has a plurality of openings 127a exposing the each n-type layer 27a to 27d, is formed.

As described above, since the light receiving surface of the PD 122d is inclined, incident light from the gap occurring between the microlens 123b and the microlens 123d or the gap occurring between the microlens 123c and the microlens 123d is shielded to hardly enter the PD 122d. Accordingly, it is prevented that an increase of light receiving amount of the fourth pixel 121d due to incident light from the gap mentioned above, and light of approximately uniform quantity is incident on the each PD 122a, 122d of each of the first pixel 121a and the fourth pixel 121d which are the dedicated imaging pixel.

Note that an inclination angle of the slope 125a may be appropriately decided according to an incident angle of the incident light from the gap. Specifically, an angle of the slope 125a against the surface 124a of the p-well layer 124 is made larger than the maximum value of an angle of the incident light from the gap against the lens forming surface 34a (zero degree when being parallel to the lens forming surface 34a). Accordingly, it can surely prevent incidence of light from the gap to the PD 122d.

Twelfth Embodiment

Figure 21:
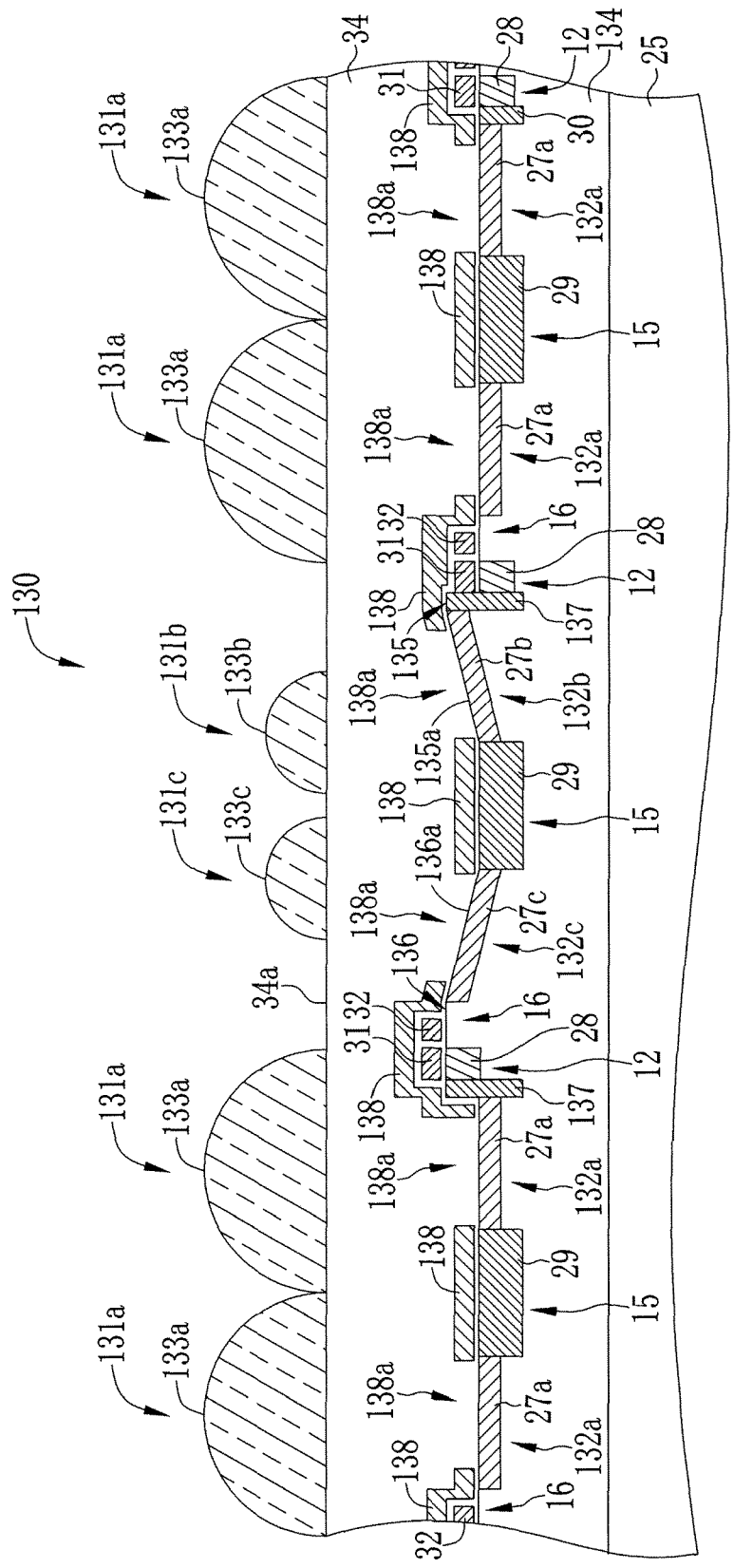
FIG. 21 is a partial cross-sectional view showing an example in which a PD of phase difference detection pixel is inclined.

Next, a twelfth embodiment of the present invention will be explained. As illustrated in FIG. 21, a pixel group 130 of this embodiment is comprised of three kinds of pixels which are a first pixel 131a, a second pixel 131b and a third pixel 131c. The each pixel 131a to 131c includes each PD 132a to 132c and each microlens 133a to 133c. The each microlens 133a to 133c has the same constitution as the each embodiment mentioned above.

Figure 22:
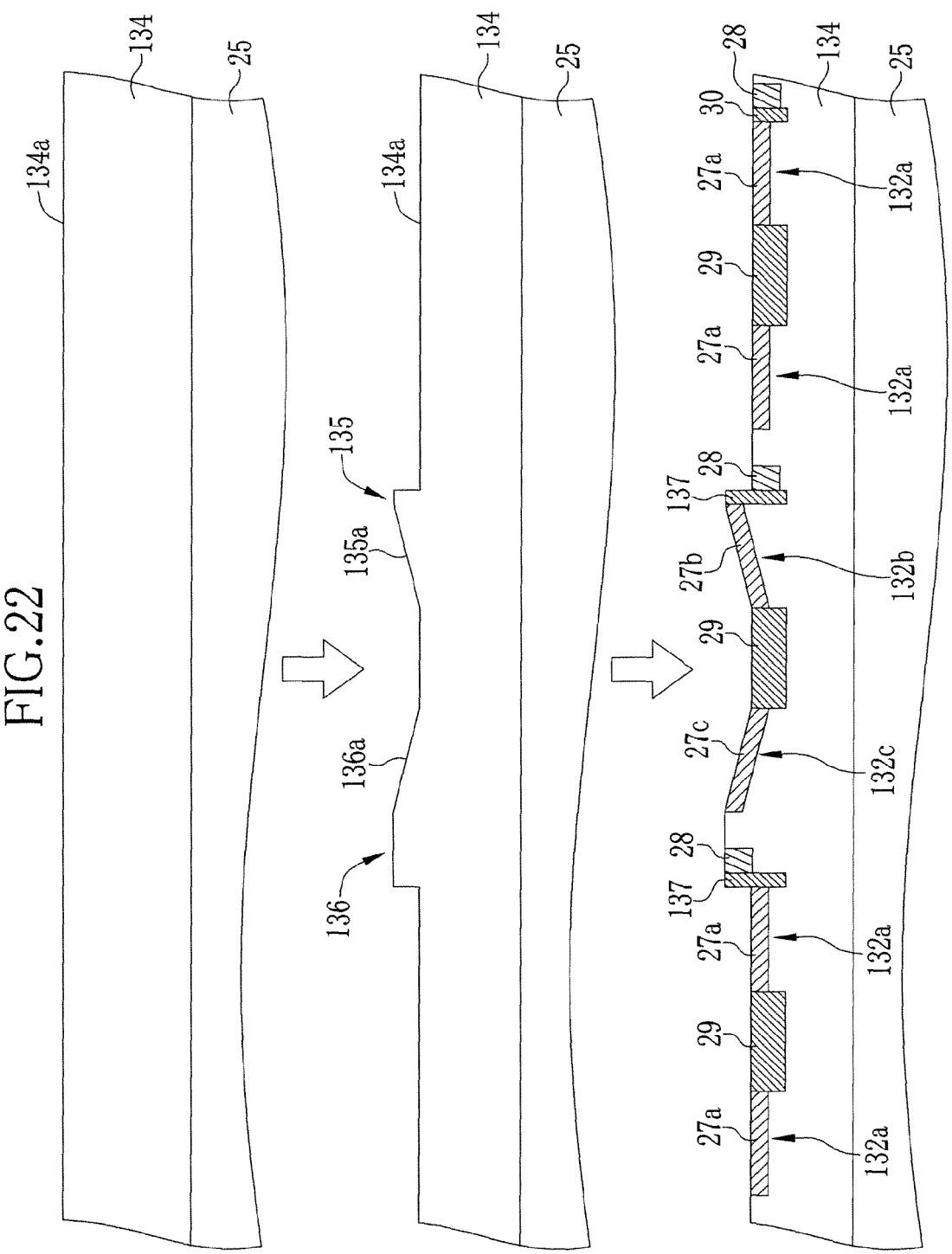
FIG. 22 is an explanatory diagram showing a production procedure when the PD of phase difference detection pixel is inclined.

As illustrated in FIG. 22, on a surface 134a of a p-well layer 134, a convex section 135 is formed at a position corresponding to the second pixel 131b, and a convex section 136 is formed at a position corresponding to the third pixel 131c. The each convex section 135, 136 is formed in a shape of a prism having the section of an approximately trapezoid, and has each slope 135a, 136a which is slanted a predetermined angle from the surface 134a of the p-well layer 134.

The convex section 135 is formed so that the slope 135a faces a direction of the microlens 133b of the corresponding second pixel 131b. Similarly, the convex section 136 is formed so that the slope 136a faces a direction of the microlens 133c of the corresponding third pixel 131c. The each convex section 135, 136 can be formed by the gray scale lithography technique same as the convex section 125 of the eleventh embodiment.

The PD 132a is formed on the surface 134a of the p-well layer 134. The PD 132b is formed on the slope 135a of the convex section 135. The PD 132c is formed on the slope 136a of the convex section 136. Accordingly, the each PD 132b, 132c inclines so that the light receiving surface faces the direction of the each microlens 133b, 133c of the each concerned pixel 131b, 131c.

On the each convex section 135, 136, also the VCCD 12 corresponding to the each PD 132b, 132c, and the readout gate 16 are formed. These parts are composed after forming the each convex section 135, 136 on the p-well layer 134, by forming the n-type layers 27a to 27d, 28 and p+ layers 29, 30, 137 with using a well-known lithography technique or doping technique at predetermined positions. The p+ layer 137 to partition the PD 132a from the PD 132b, and partition the PD 132b from the PD 132c is formed more deeply than the p+ layer 30 corresponding to the each convex section 135, 136. In addition, on the surface 134a of the p-well layer 134, like the each embodiment described above, a light shielding film 138, which covers the transfer electrodes 31, 32 and has a plurality of openings 138a exposing the each n-type layer 27a to 27d, is formed.

As described above, since the each PD 132b, 132c is formed on the each slope 135a, 136a of the each convex section 135, 136, by a corner of the each convex section 135, 136, and structures such as the transfer electrodes 31, 32 and the light shielding film 138 provided at positions close to this corner, incident light from the gap occurring between the microlens 133a and the microlens 133b or the gap occurring between the microlens 133a and the microlens 133c is shielded to hardly enter the PD 132a.

Accordingly, it is prevented that an increase of light receiving amount of the adjacent first pixel 131a due to incident light from the gap mentioned above, and light of approximately uniform quantity is incident on the PD 132a of the first pixel 131a which is the dedicated imaging pixel.

In addition, since the each PD 132*b*, 132*c* is formed to have the inclination as described above, the incident angle of the light from the each microlens 133*b*, 133*c* against the normal of the light receiving surface becomes small, and receiving efficiency of the light condensed by the each microlens 133*b*, 133*c* improves. Accordingly, in this embodiment, the light receiving amount of each of the second pixel 131*b* and the third pixel 131*c* increases.

Although the pixel group of the arrangement of the 16 pixels in the 4 by 4 rectangular grid is illustrated in the each embodiment mentioned above, the number of the pixels included in the pixel group, and the arrangement of the pixels are not limited as above and may be appropriately changed. In addition, although the second pixel and the third pixel which are the phase difference detection pixel are located to be adjacent in the each embodiment mentioned above, the second pixel and the third pixel are not required to be adjacent.

In the each embodiment mentioned above, although the CCD image sensor 10 in which the pixels are in the honeycomb arrangement is illustrated, the present invention is not limited to this, and for example, it may apply to a CCD image sensor in which pixels of an approximately rectangular shape are arranged in a shape of a tetragonal lattice. Furthermore, the present invention can apply to other types of the solid-state imaging device such as a CMOS image sensor.

In addition, the solid-state imaging device may be constituted by a combination of the above embodiments, for example that the microlens of each of the second pixel and the third pixel is formed to the nonspherical shape, and the height of the PD of each of the second pixel and the third pixel is made higher.

What is claimed is:

1. A solid-state imaging device comprising:
   a plurality of phase difference detection pixels having a microlens whose optical axis is shifted in a predetermined direction from a center of a light receiving surface of a photoelectric conversion element; and
   a plurality of dedicated imaging pixels having a microlens which is larger than the microlens of the phase difference detection pixel and is disposed such that its optical axis is approximately coincidence with the center of a light receiving surface of a photoelectric conversion element, wherein the microlens arranged around the phase difference detection pixel is formed smaller than the other microlens.

2. The solid-state imaging device according to claim 1, wherein the plurality of dedicated imaging pixel have microlenses of at least three sizes, and the size of the microlens becomes smaller progressively as its position becomes closer to the phase difference detection pixel.

3. The solid-state imaging device according to claim 1, wherein a part of the microlens of the phase difference detection pixel enters into a vacant space of the adjacent dedicated imaging pixel.

4. A solid-state imaging device comprising:
   a plurality of phase difference detection pixels having a microlens whose optical axis is shifted in a predetermined direction from a center of a light receiving surface of a photoelectric conversion element; and
   a plurality of dedicated imaging pixels having a microlens which is larger than the microlens of the phase difference detection pixel and is disposed such that its optical axis is approximately coincidence with a center of a light receiving surface of a photoelectric conversion element, wherein a height of the microlens arranged around the phase difference detection pixel from the photoelectric conversion element is lower than a height of the microlens of the phase difference detection pixel.

5. The solid-state imaging device according to claim 4, wherein a concave section is formed on a lens forming surface where the each microlens is formed, at a position corresponding to the dedicated imaging pixel arranged around the phase difference detection pixel and that by forming the microlens on an inner bottom surface of the concave section, a height of the microlens arranged around the phase difference detection pixel from the photoelectric conversion element becomes lower than a height of the microlens of the phase difference detection pixel.

6. The solid-state imaging device according to claim 5, wherein by forming a plurality of concave sections of different depth on the lens forming surface, the height of the microlens of the dedicated imaging pixel becomes lower progressively as its position becomes closer to the phase difference detection pixel.

7. The solid-state imaging device according to claim 5, wherein a part of the microlens of the phase difference detection pixel gets into a space formed by making the height of the microlens of the adjacent dedicated imaging pixel lower.

8. The solid-state imaging device according to claim 4, wherein on a lens forming surface where the each microlens is formed, a convex section is formed at a position corresponding to the phase difference detection pixel, and that by forming the microlens on the convex section, the height of the microlens of the phase difference detection pixel becomes higher than the height of the microlens of the dedicated imaging pixel.

9. A solid-state imaging device comprising:
   a plurality of dedicated imaging pixels having a microlens which is disposed such that its optical axis is approximately coincidence with a center of a light receiving surface of a photoelectric conversion element; and
   a plurality of phase difference detection pixels having a microlens which is smaller than the microlens of the dedicated imaging pixel and is disposed such that its optical axis is shifted in a predetermined direction from the center of a light receiving surface of a photoelectric conversion element, wherein the microlens has a nonspherical shape where a bottom portion is extended toward a border part with the adjacent dedicated imaging pixel.

10. A solid-state imaging device comprising:
    a plurality of phase difference detection pixels having a microlens whose optical axis is shifted in a predetermined direction from the center of a light receiving surface of a photoelectric conversion element; and
    a plurality of dedicated imaging pixels which is larger than the microlens of the phase difference detection pixel and is disposed such that its optical axis is approximately coincidence with a center of a light receiving surface of a photoelectric conversion element, wherein a height of the photoelectric conversion element arranged around the phase difference detection pixel was lowered on a semiconductor substrate than a height of the photoelectric conversion element of the phase difference detection pixel.

11. The solid-state imaging device according to claim 10, wherein on a surface of the semiconductor substrate, a concave section is formed at a position corresponding to the dedicated imaging pixel arranged around the phase difference detection pixel, and that by forming the photoelectric conversion element on an inner bottom surface of the concave section, the height of the photoelectric conversion element arranged around the phase difference detection pixel becomes lower than the height of the photoelectric conversion element of the phase difference detection pixel.

12. The solid-state imaging device according to claim 10, wherein on a surface of the semiconductor substrate, a convex section is formed at a position corresponding to the phase difference detection pixel, and that by forming the photoelectric conversion element on the convex section, the height of the photoelectric conversion element of the phase difference detection pixel becomes higher than the height of the photoelectric conversion element of the dedicated imaging pixel.

13. The solid-state imaging device according to claim 12, wherein the convex section has a slope which was formed to be directed toward the microlens of the phase difference detection pixel, and that the photoelectric conversion element of the phase difference detection pixel is formed on the slope.

14. The solid-state imaging device according to claim 10, wherein the dedicated imaging pixel and the phase difference detection pixel have an inner lens under the microlens, and that a shape of each inner lens is changed according to distance with the photoelectric conversion element so that a focus matches the photoelectric conversion element.

15. A solid-state imaging device comprising:
a plurality of phase difference detection pixels having a microlens whose optical axis is shifted in a predetermined direction from the center of a light receiving surface of a photoelectric conversion element; and
a plurality of dedicated imaging pixels having a microlens which is larger than the microlens of the phase difference detection pixel and is disposed such that its optical axis is approximately coincidence with the center of a light receiving surface of a photoelectric conversion element, wherein the photoelectric conversion element arranged around the phase difference detection pixel is inclined such that the light receiving surface is directed to a direction opposite to the phase difference detection pixel.

* * * * *